United States Patent
Kawamonzen et al.

(10) Patent No.: US 6,316,170 B2
(45) Date of Patent: Nov. 13, 2001

(54) DEVELOPING SOLUTION AND METHOD OF FORMING POLYIMIDE PATTERN BY USING THE DEVELOPING SOLUTION

(75) Inventors: Yoshiaki Kawamonzen, Machida; Shigeru Matake; Rumiko Hayase, both of Yokohama; Satoshi Mikoshiba, Yamato, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/526,470

(22) Filed: Mar. 15, 2000

(30) Foreign Application Priority Data

Mar. 15, 1999 (JP) .................................. 11-069112
Mar. 10, 2000 (JP) .................................. 12-66836

(51) Int. Cl.[7] .................................................. G03F 7/30
(52) U.S. Cl. ...................... 430/330; 430/281.1; 430/331
(58) Field of Search ............................. 430/331, 281.1, 430/330

(56) References Cited

U.S. PATENT DOCUMENTS

| | | | |
|---|---|---|---|
| 4,093,461 | 6/1978 | Loprest et al. | 430/193 |
| 5,340,684 | 8/1994 | Hayase | 430/165 |
| 5,348,835 | 9/1994 | Oba et al. | 430/192 |
| 5,484,470 * | 1/1996 | Kristjansdottir et al. | 75/722 |
| 5,518,864 * | 5/1996 | Oba et al. | 430/325 |
| 5,753,407 * | 5/1998 | Oba | 430/191 |
| 5,858,584 * | 1/1999 | Okabe et al. | 430/18 |
| 6,001,517 | 12/1999 | Kawamonzen | 430/18 |
| 6,100,315 * | 8/2000 | Kitamura et al. | 523/160 |

FOREIGN PATENT DOCUMENTS

| | | |
|---|---|---|
| 62-135824 | 6/1987 | (JP) . |
| 5-005996 | 1/1993 | (JP) . |
| 6-043648 | 2/1994 | (JP) . |

OTHER PUBLICATIONS

Shuzi Hayase, et al., "Photosensitive Polymides Consisting of Simple Mixtures of 4–Substituted Diazonaphthoquinones and Polyamic Acids", Polymers for Advanced Technologies, vol. 4, 1992, pp. 302–308.

Toshihiko Omote, et al., "A New Positive–Type Photoreactive Polyimide Precursor Using 1,4–Dihydropyridine Derivative", Polymer Engineering and Science, vol. 32, No. 21, 1992, pp. 1634–1641.

* cited by examiner

*Primary Examiner*—Hoa Van Le
(74) *Attorney, Agent, or Firm*—Oblon, Spivak, McClelland, Maier & Neustadt, P.C.

(57) ABSTRACT

Disclosed is a developing solution for a photosensitive polyimide, which consists of an aqueous solution of an amine compound having a base dissociation index pKb [$=-\log (Kb) = -\log (Kw/Ka) = 14-pKa$, where Kb is a base dissociation constant, Ka is acid dissociation constant of a proton complex, pKa is an acid dissociation index of a proton complex$=-\log (Ka)$, and Kw is an ion product of water$=1\times 10^{-14}$] of 5 to 8 within an aqueous solution of 25° C.

20 Claims, 1 Drawing Sheet

DEVELOPING SOLUTION AND METHOD OF FORMING POLYIMIDE PATTERN BY USING THE DEVELOPING SOLUTION

CROSS-REFERENCE TO RELATED APPLICATION

This application is based upon and claims the benefit of priority from the prior Japanese Patent Application No. 11-069112, filed Mar. 15, 1999, the entire contents of which are incorporated herein by reference.

BACKGROUND OF THE INVENTION

The present invention relates to a developing solution for a photosensitive resin, which permits markedly improving the residual film characteristics and the resolution characteristics in the formation of a photosensitive polyimide pattern used as, for example, an insulating member, a protective film member, a liquid crystal element member or an optical element member. The present invention also relates to a pattern forming method that permits obtaining a polyimide film pattern excellent in resolution, heat resistance and adhesivity and used for forming an insulating film, a protective film, an α-ray shielding film or an optical waveguide of various electronic parts. Further, the present invention relates to an electronic part prepared by employing the particular pattern forming method.

In the ordinary semiconductor device comprising a semiconductor substrate, the surface of the semiconductor substrate bearing semiconductor elements is generally covered with a protective film called a passivation film for the purpose of improving the reliability of the semiconductor device by protecting the semiconductor elements from any influence by the outer environment. As a material for this passivation film, polyimide resin is extensively employed in view of its excellent properties such as electric properties, e.g. insulating characteristics, radiation resistance, environmental stability and heat resistance. Furthermore, this polyimide is widely employed in a semiconductor device as an α-ray shielding film, or as an interlayer insulating film for a multilayered wiring structure or for a multilayered element structure (a multichip module).

This polyimide can be easily formed into a film from polyamic acid which is a precursor for the polyimide. Namely, a varnish of polyamic acid is coated on the surface of a predetermined substrate and then the coated layer is heated to form a film of polyamic acid, which is then heat-treated at a high temperature thereby to cause a cyclo-dehydration reaction of the polyamic acid to take place, thus curing the polyamic acid film and forming a polyimide film. It is possible, with the employment of this method, to easily form a film of polyimide in spite of the fact that polyimide can be hardly worked since it is not or hardly soluble to most of organic solvents and is high in softening point. Therefore, the aforementioned method has been widely adopted in the formation of polyimide film.

Meanwhile, in the manufacture of a semiconductor device, various workings, for example, for forming a through-hole in a multilayered wiring structure or for forming a pad for effecting an electric connection with an external lead are required. In order to carry out these workings, a polyimide film formed as a protective film (passivation film) or an interlayer insulating film as explained above is required to be patterned thereby to form holes or grooves of predetermined patterns. Generally, the patterning of polyimide film is performed by making use of PEP (photo-engraving process) using a photoresist. Namely, after a polyimide film is formed on the surface of a semiconductor substrate bearing a semiconductor element thereon by the aforementioned method, a photoresist film is formed on the surface of the polyimide film and then subjected to a light exposure process followed by a development process thereby forming a resist pattern. Then, the underlying polyimide film is selectively etched by using this resist pattern as an etching mask thereby to form a polyimide protective film or interlayer insulating film having a prescribed pattern.

However, the aforementioned method of forming a polyimide pattern requires two independent steps, i.e. a step of forming a polyimide film and a step of the PEP, making the method troublesome to carry out.

With a view to solve the aforementioned drawback in carrying out the method, a method of patterning a polyimide film without employing the PEP has been demanded. In response to such a demand, a resin composition comprising a polyimide precursor has been proposed.

For example, each of Japanese Patent Disclosure (Kokai) No. 52-13315 and Japanese Patent Disclosure No. 62-135824 discloses a composition prepared by adding an o-quinone diazide compound as a photosensitizer to a polyimide precursor as a photosensitive resin composition having a photosensitivity of positive type.

Each of these photosensitive resin compositions is prepared by adding a photosensitizer (inhibitor of a photosensitive dissolution) to a polyimide precursor, i.e., polyamic acid. For forming a polyimide film pattern by using such a photosensitive resin composition, a substrate surface is coated with a solution of the photosensitive resin composition, followed by drying the coating to form a resin layer and subsequently forming a pattern by light exposure and developing treatments. Further, a heat treatment is applied to the resin layer so as to cure, or imidize, the polyimide precursor by a dehydration-cylization reaction.

These photosensitive resin compositions can be developed with an alkaline developing solution. It was customary to use as the alkaline developing solution for the photosensitive polyimide an aqueous solution of an inorganic alkaline material such as sodium hydroxide, potassium hydroxide, sodium carbonate and potassium carbonate and an organic alkaline material such as tetramethyl ammonium hydroxide, choline, triethyl amine, ethanol amine, or diethyl ethanol amine, said aqueous solution being widely used as an alkaline developing solution for a photoresist material.

These inorganic and organic alkaline materials are compounds having a very strong basicity. Specifically, these inorganic and organic alkaline materials have a base dissociation index pKb not larger than 4.5 (i.e., acid dissociation index pKa of the proton complex not smaller than 9.5). Since an aqueous solution of these inorganic and organic alkaline materials dissolves the photosensitive polyimide very rapidly, the aqueous solution is used as a dilute solution having a concentration not higher than 0.05 mol/L (liter).

However, use of the conventional developing solution for the photosensitive polyimide gives rise to serious problems that the resolution characteristics and the residual film characteristics are very poor.

BRIEF SUMMARY OF THE INVENTION

An object of the present invention, which has been achieved in view of the above-noted problems inherent in the prior art, is to provide a developing solution capable of markedly improving the resolution characteristics and the residual film characteristics of the photosensitive polyimide.

Another object of the present invention is to provide a pattern forming method that permits forming a polyimide film pattern excellent in resolution characteristics and residual film characteristics without using separately a photoresist.

According to a first aspect of the present invention, there is provided a developing solution consisting of an aqueous solution of an amine compound having a base dissociation index pKb of 5 to 8 within the aqueous solution at 25° C.

According to a second aspect of the present invention, there is provided a developing solution consisting of an aqueous solution of a substituted or unsubstituted N-substituted imidazole having a base dissociation index pKb of 5 to 8 within the aqueous solution at 25° C.

Further, according to a third aspect of the present invention, there is provided a method of forming a polyimide film pattern, comprising the steps of:

(I) coating a substrate surface with a photosensitive polyimide solution of a positive type containing a polyimide precursor and a photosensitive dissolution inhibitor, followed by heating the coating to form a resin layer;

(II) exposing a desired region of said resin layer to light;

(III) developing the resin layer after the light exposure with a developing solution consisting of an aqueous solution of an amine compound having a base dissociation index pKb of 5 to 8 within the aqueous solution at 25° C.; and (V) applying a heat treatment to the resin layer after the development.

The developing solution of the present invention is suitably used for development of a photosensitive polyimide pattern.

It is desirable for the polyimide precursor used in the method of forming a polyimide film pattern to be a polyamic acid having a repeating unit represented by a general formula (1) given below:

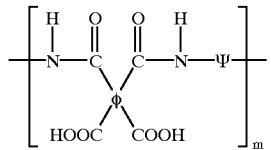

(1)

where φ represents a tetravalent organic group selected from the group consisting of a substituted or unsubstituted aliphatic hydrocarbon group having 1 to 30 carbon atoms, a substituted or unsubstituted alicyclic hydrocarbon group having 1 to 30 carbon atoms, a substituted or unsubstituted aromatic hydrocarbon group having 1 to 30 carbon atoms, a substituted or unsubstituted heterocyclic group having 1 to 30 carbon atoms, and a compound group having an aliphatic hydrocarbon group, an alicyclic hydrocarbon group, an aromatic hydrocarbon group or a heterocyclic group coupled with each other directly or with a crosslinking group interposed therebetween, Ψ represents a divalent organic group selected from the group consisting of a substituted or unsubstituted aliphatic hydrocarbon group having 1 to 30 carbon atoms, a substituted or unsubstituted alicyclic hydrocarbon group having 1 to 30 carbon atoms, a substituted or unsubstituted aromatic hydrocarbon group having 1 to 30 carbon atoms, a substituted or unsubstituted heterocyclic group having 1 to 30 carbon atoms, and a compound group having an aliphatic hydrocarbon group, an alicyclic hydrocarbon group, an aromatic hydrocarbon group or a heterocyclic group coupled with each other directly or with a crosslinking group interposed therebetween, and m is a positive integer.

It is particularly desirable to use a polyamic acid as the polyimide precursor. The polyamic acid suitable for use in the present invention can be synthesized by the reaction within an organic solvent among 1.0 molar equivalent of tetracarboxylic dianhydride component containing at least 0.6 molar equivalent of at least one kind of diphthalic dianhydride selected from the group consisting of 3,3',4,4'-benzophenone tetracarboxylic dianhydride, methylene-4,4'-diphthalic dianhydride, 1,1-ethylidene-4,4'-diphthanlic dianhydride, 2,2-propylidene-4,4'-diphthalic dianhydride, 1,1,1,3,3,3-hexafluoro-2,2-propylidene-4,4'-diphthalic dianhydride, oxy-4,4'-diphthalic dianhydride,
thio-4,4'-diphthalic dianhydride, sulfonyl-4,4'-diphthalic acid dianhydride, 1,3-bis(3,4-dicarboxyphenyl)-1,1,3,3-tetramethyl disiloxane dianhydride, 9-phenyl-9-(trifluoromethyl)xantene-2,3,6,7-tetracarboxylic dianhydride, and 9,9-bis(trifluoromethyl)xantene-2,3,6,7-tetracarboxylic dianhydride; 0.8 to 1.2 molar equivalent of diamine compound containing at least 0.6 molar equivalent of at least one kind of a dianiline derivative selected from the group consisting of oxy-3,3'-dianiline, oxy-3,4'-dianiline, oxy-4,4'-dianiline, sulfonyl-3,3'-dianiline, sulfonyl-4,4'-dianiline, methylene-3,3'-dianiline, methylene-4,4'-dianiline, 2,2-propylidene-3,3'-dianiline,
2,2-propylidene-4,4'-dianiline, 1,1,1,3,3,3-hexafluoro-2,2-propylidene-3,3'-dianiline, 1,1,1,3,3,3-hexafluoro-2,2-propylidene-4,4'-dianiline, 1,1,1,3,3,3-hexafluoro-2,2-propylidene-5,5'-di(2-toluidine), and 1,1,1,3,3,3-hexafluoro-2,2-propylidene-4,4'-bis(2-aminophenol); and 0.02 to 0.2 molar equivalent of at least one kind of a siloxane compound selected from the group consisting of 1,3-bis(3-aminopropyl)-1,1,3,3-tetramethyl disiloxane, 1,5-bis(3-aminopropyl)-1,1,3,3,5,5-hexamethyl trisiloxane, 1,7-bis(3-aminopropyl)-1,1,3,3,5,5,7,7-octamethyl tetrasiloxane, and 1,11-bis(3-aminopropyl)-1,1,3,3,5,5,7,7,9,9,11,11-dodecamethyl hexasiloxane.

It is desirable for the photosensitive dissolution inhibitor used in the method of forming a polyimide film pattern to be a naphthoquinone diazide sulfonic ester compound or a naphthoquinone diazide sulfonic acid amide compound obtained by the reaction between a phenol compound or an aniline compound and naphthoquinone diazide sulfonyl chloride compound.

It is particularly desirable to use at least one kind of the naphthoquinone diazide compound selected from the compounds represented by general formulas (2) to (5) given below:

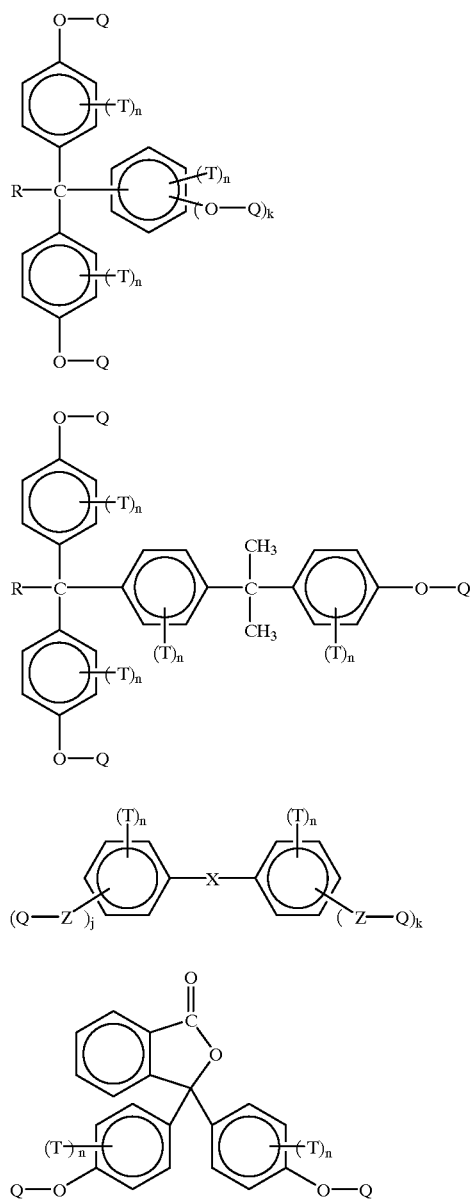

where Q, which may be the same or different, represents a hydrogen atom, a 1,2-naphtoquinone-2-diazide-4-sulfonyl group or a 1,2-naphtoquinone-2-diazide-5-sulfonyl group, at least one substituent Q being a 1,2-naphtoquinone-2-diazide-4-sulfonyl group or a 1,2-naphtoquinone-2-diazide-5-sulfonyl group; R, which may be the same or different, represents a hydrogen atom, a substituted or unsubstituted aliphatic hydrocarbon group, a substituted or unsubstituted alicyclic hydrocarbon group, a substituted or unsubstituted aromatic hydrocarbon group, or a substituted or unsubstituted heterocyclic group; T, which may be the same or different, represents a substituted or unsubstituted aliphatic hydrocarbon group, a substituted or unsubstituted alicyclic hydrocarbon group, a substituted or unsubstituted aromatic hydrocarbon group, or a substituted or unsubstituted heterocyclic group; X represents an oxy group, a thio group, a sulfonyl group, a carbonyl group, a methylene group, an ethylidene group, a 2,2-propylidene group, a 1,1,1,3,3,3-hexafluoro-2,2-propylidene group, a 1-phenyl-1,1-ethylidene group, a 1,1-cyclohexylidene group or a 9,9-fluorenylidene group; Z represents an oxy group or an imino group, j is an integer of 0 to 3, k, which may be the same or different, is an integer of 1 to 3, and n, which may be the same or different, is an integer of 0 to 4.

The present invention provides an electronic part comprising the polyimide film pattern formed by the polyimide film pattern-forming method of the present invention as at least an insulating member, a protective film member, a liquid crystal element member or an optical element member.

The present inventors have paid attentions to the fact that the carboxyl group of a polyimide precursor (polyamic acid) used as a base polymer of a photosensitive polyimide has a low acid dissociation index pKa, which is 3.5 to 4.5, arriving at the present invention. In the case of using the developing solution of the present invention for a photosensitive polyimide, it is possible to dissolve promptly the polyamic acid in the dissolved portion without impairing the mutual function between the carboxyl group of the polyimide precursor (polyamic acid) of the undissolved portion and the dissolution inhibitor.

To be more specific, the developing solution of the present invention using an amine compound or a cyclic amine compound having a base dissociation index pKb of 5 to 8 (an acid dissociation index pka of 6 to 9) within the aqueous solution at 25° C. makes it possible to maintain an associated body between the polyamic acid and the photosensitive dissolution inhibitor without impairing the association between the carboxyl group of the polyamic acid and the photosensitive dissolution inhibitor such as a naphthoquinone diazide compound. At the same time, it is possible to dissolve and remove selectively the polyamic acid in the portion where the photosensitive dissolution inhibitor is decomposed by the photoreaction in the light-exposed portion so as to loose its dissolution inhibiting function. It follows that the dissolved portion can be promptly dissolved and removed while scarcely corroding the film in the undissolved portion.

As described above, in forming a pattern of a photosensitive polyimide film, the dissolved portion can be promptly dissolved while scarcely corroding the film in the undissolved portion by using the developing solution of the present invention in the developing step, making it possible to form a fine polyimide film pattern with a high resolution and a high residual film ratio.

Incidentally, in the case of using a developing solution using an amine compound having a base dissociation index pKb that is less than 5 (or where an acid dissociation index pKa of the proton complex exceeds 9), which fails to fall within the scope of the present invention, the basicity of the developing solution is unduly high so as to inhibit the mutual function between the carboxyl group of the polyamic acid and the photosensitive dissolution inhibitor. In this case, the associated body between the polyamic acid and the photosensitive dissolution inhibitor is hydrolyzed. As a result, the film in the undissolved portion is greatly corroded so as to markedly lower the resolution and the residual film characteristics of the photosensitive polyimide. On the other hand, in the case of using a developing solution using an amine compound having a base dissociation index pKb that is larger than 8 (or where an acid dissociation index pKa of the proton complex is less than 6), which fails to fall within the scope of the present invention, the basicity of the developing solution is unduly weak, resulting in failure to dissolve and remove the polyamic acid. It follows that it is impossible to form a pattern of a photosensitive polyimide film.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
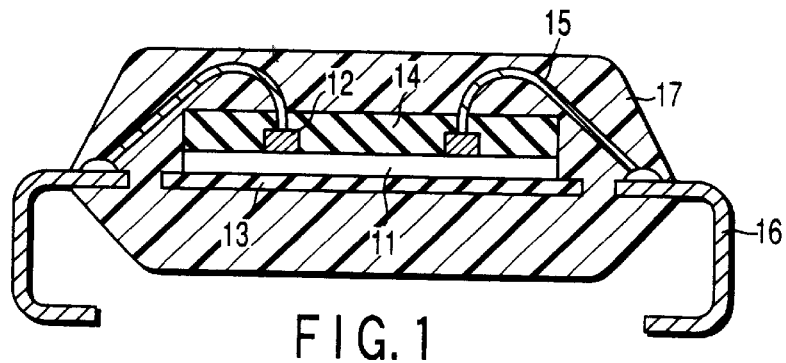
FIG. 1 is a cross-sectional view of a semiconductor element provided with a passivation film consisting of a polyimide film pattern which has been obtained by pattern forming method according to the present invention.

The developing solution of the present invention will now be described.

The developing solution of the present invention for a photosensitive polyimide consists of an aqueous solution of an amine compound having a base dissociation index pKb of 5 to 8 within the aqueous solution at 25° C.

A base dissociation constant Kb of the amine compound A within an aqueous solution, an acid dissociation constant Ka of the proton complex $HA^+$ of the amine compound, and an ion product of water Kw are represented by following formulas, respectively:

$$Kb = \frac{[HA^+] \cdot [OH^-]}{[A]}$$

$$Ka = \frac{[H^+] \cdot [A]}{[HA^+]}$$

$$Kw = [H^+] \cdot [OH^-] = Ka \cdot Kb$$

where [A] is a molar concentration of the amine compound A, $[HA^+]$ is a molar concentration of the proton complex of the amine compound, $[OH^-]$ is a molar concentration of a hydroxide ion, and $[H^+]$ is a molar concentration of a hydrogen ion (proton).

The relationship between the base dissociation index pKb of the amine compound within an aqueous solution and the acid dissociation index pKa of a proton complex of the amine compound is represented by the formula given below:

$$pKb = -\log(Kb)$$
$$= -\log(Kw/Ka)$$
$$= -\log(Kw) - pKa$$

$$(pKa = -\log(Ka))$$

Since the ion product of water in an aqueous solution of 25° C. is $1 \times 10^{-14}$ (mol$^2$/L$^2$), the base dissociation index pKb at 25° C. is represented as follows:

$$pKb = 14 - pKa$$

The amine compound having a base dissociation index pKb of 5 to 8 in an aqueous solution of 25° C. is equal to an amine compound having the acid dissociation index pKa of the proton complex of 6 to 9 within an aqueous solution of 25° C.

The amine compound used in the developing solution of the present invention is an amine compound having a base dissociation index pKb of 5 to 8 within an aqueous solution of 25° C., i.e., an amine compound having an acid dissociation index pKa of the proton complex of 6 to 9. Particularly, it is desirable to use an amine compound having pKa of 6 to 7 within an aqueous solution of 25° C., (i.e., an amine compound having pKa of the proton complex of 7 to 8 within an aqueous solution of 25° C.). A developing solution containing the amine compound meeting the particular requirement is excellent in its resolution characteristics and residual film characteristics.

The amine compound used in the present invention, which has pKb of 5 to 8 within an aqueous solution of 25° C., represents a cyclic amine compound or an acyclic amine compound having pKb of 5 to 8 within an aqueous solution of 25° C. To be more specific, the particular amine compound used in the present invention includes, for example, a substituted or unsubstituted imidazole, a substituted or unsubstituted morpholine, a substituted or unsubstituted pyrroline, a substituted or unsubstituted N-(2-cyanoethyl) piperazine, a substituted or unsubstituted N-propargyl piperazine, a substituted or unsubstituted N-(2-hydroxyethyl) piperazine, a substituted or unsubstituted 2-aminopropyonitrile, a substituted or unsubstituted propargyl amine, a substituted or unsubstituted triethanol amine, a substituted or unsubstituted diethanol amine, and a substituted or unsubstituted tris (hydroxymethyl)amino methane.

The substituent groups introduced into the cyclic amine compounds or the acyclic amine compounds noted above include, for example, aliphatic hydrocarbon groups given in item (A) below, alicyclic hydrocarbon groups given in item (B) below, aromatic hydrocarbon groups given in item (C) below, heterocyclic groups given in item (D) below, characteristic groups given in item (a) below, substituted aliphatic hydrocarbon groups in which the characteristic group in item (a) is substituted in the aliphatic hydrocarbon groups, substituted alicyclic hydrocarbon groups in which the characteristic group in item (a) is substituted in the alicyclic hydrocarbon groups, substituted aromatic hydrocarbon groups in which the characteristic group in item (a) is substituted in the aromatic hydrocarbon groups, and substituted heterocyclic groups in which the characteristic group in item (a) is substituted in the heterocyclic groups.

(A) Aliphatic Hydrocarbon Groups:

The aliphatic hydrocarbon group is at least one aliphatic hydrocarbon group selected from methyl, ethyl, propyl, isopropyl, butyl, isobutyl, sec-butyl, tert-butyl, pentyl, tert-pentyl, isopentyl, neopentyl, hexyl, isohexyl, heptyl, octyl, nonyl, decyl, vinyl, allyl, isopropenyl, propenyl, methallyl, crotyl, butenyl, pentenyl, butadienyl, ethynyl, propynyl, butynyl and pentynyl group.

(B) Alicyclic Hydrocarbon Groups:

The alicyclic hydrocarbon group is at least one alicyclic hydrocarbon group selected from cyclopropyl, cyclobutyl, cyclopentyl, cyclohexyl, cycloheptyl, cyclooctyl, cyclopentenyl, cyclohexenyl, cycloheptenyl, cyclooctenyl, cyclopentadienyl, and cyclohexadienyl group.

(C) Aromatic Hydrocarbon Groups:

The aromatic hydrocarbon group is at least one aromatic hydrocarbon group selected from benzene ring, naphthalene ring, anthracene ring, phenanthrene ring, tetralin ring, azulene ring, biphenylene ring, acenaphthylene ring, acenaphthene ring, fluorene ring, triphenylene ring, pyrene ring, chrysene ring, picene ring, perylene ring, benzopyrene ring, rubicene ring, coronene ring, ovalene ring, indene ring, pentalene ring, heptalene ring, indacene ring, phenalene ring, fluoranthene ring, acephenanthrylene ring, aceanthrylene ring, naphthacene ring, pleiadene ring, pentaphene ring, pentacene ring, tetraphenylene ring, hexaphene ring, hexacene ring, trinaphthylene ring, heptaphene ring, heptacene ring and pyranthrene ring.

(D) Heterocyclic Groups:

The heterocyclic group is at least one heterocyclic group selected from pyrrole ring, pyrroline ring, pyrrolidine ring, indole ring, isoindole ring, indoline ring, isoindoline ring, indolizine ring, carbazole ring, carboline ring, furan ring, oxolane ring, coumarone ring, coumaran ring, isobenzofuran ring, phthalan ring, dibenzofuran ring, thiophene ring, thiolane ring, benzothiophene ring, dibenzothiophene ring, pyrazole ring, pyrazoline ring, indazole ring, imidazole ring, imidazoline ring, imidazolidine ring, benzimidazole ring, benzimidazoline ring, naphthimidazole ring, oxazole ring, oxazoline ring, oxazolidine ring, benzoxazole ring, benzoxazoline ring, naphthoxazole ring, isoxazole ring, benzisoxazole ring, thiazole ring, thiazoline ring, thiazolidine ring, benzothiazole ring, benzothiazoline ring, naphthothiazole ring, isothiazole ring, benzisothiazole ring, triazole ring, benzotriazole ring, oxadiazole ring, thiadiazole ring, benzoxadiazole ring, benzothiadiazole ring, tetrazole ring, purine ring, pyridine ring, piperidine ring, quinoline ring, isoquinoline ring, acridine ring, phenanthridine ring, benzoquinoline ring, naphthoquinoline ring, naphthylidine ring, phenanthroline ring, pyridazine ring, pyrimidine ring, pyrazine ring, piperazine ring, phthalazine ring, quinoxaline ring, quinazoline ring, cinnoline ring, phenazine ring, perimidine ring, triazine ring, tetrazine ring, pteridine ring, oxazine ring, benzoxazine ring, phenoxazine ring, thiazine ring, benzothiazine ring, phenothiazine ring, oxadiazine ring, thiadiazine ring, dioxolane ring, benzodioxole ring, dioxane ring, benzodioxane ring, dithiolane ring, benzodithiol ring, dithiane ring, benzodithiane ring, pyrane ring, chromene ring, xanthene ring, oxane ring, chroman ring, isochroman ring, trioxane ring, thiane ring, trithiane ring, morpholine ring, quinuclidine ring, selenazole ring, benzoselenazole ring, naphthoselenazole ring, tellurazole ring and benzotellurazole ring.

(a) Characteristic Groups:

The characteristic group is at least one characteristic group selected from di-substituted amino group (dimethylamino, diethylamino, dibutylamino, ethylmethylamino, butylmethylamino, diamylamino, dibenzylamino, diphenethylamino, diphenylamino, ditolylamino, dixylylamino, methylphenylamino and benzylmethylamino group); mono-substituted amino group (methylamino, ethylamino, propylamino, isopropylamino, tert-butylamino, anilino, anisidino, phenetidino, toluidino, xylidino, pyridylamino, thiazolylamino, benzylamino and benzylideneamino group); cyclic amino group (pyrrolidino, piperidino, piperazino, morpholino, 1-pyrrolyl, 1-pyrazolyl, 1-imidazolyl and 1-triazolyl group); acylamino group (formylamino, acetylamino, benzoylamino, cinnamoylamino, pyridinecarbonylamino and trifluoroacetylamino group); sulfonylamino group (mesylamino, ethylsulfonylamino, phenylsulfonylamino, pyridylsufonylamino, tosylamino, taurylamino, trifluoromethylsulfonylamino, sulfamoylamino, methylsulfamoylamino, sulfanylamino and acetylsulfanylamino group); amino group; hydroxyamino group; ureido group; semicarbazido group; carbazido group; di-substituted hydrazino group (dimethylhydrazino, diphenylhydrazino and methylphenylhydrazino group); mono-substituted hydrazino group (methylhydrazino, phenylhydrazino, pyridylhydrazino and benzylidenehydrazino group); hydrazino group; amidino group; oxime group (hydroxyiminomethyl, methoxyiminomethyl, ethoxyiminomethyl, hydroxyiminoethyl, hydroxyiminopropyl group, etc.); hydroxyl group; oxy group (methoxy, ethoxy, propoxy, butoxy, hydroxyethoxy, phenoxy, naphthoxy, pyridyloxy, thiazolyloxy and acetoxy group); thio group (methylthio, ethylthio, phenylthio, pyridylthio and thiazolylthio group); alkoxyalkyl group (hydroxymethyl, hydroxyethyl and hydroxypropyl group); cyano group; cyanato group; thiocyanato group; nitro group; nitroso group; mercapto group; halogen group (fluoro, chloro, bromo and iodo group); carboxyl group and the salts thereof; oxycarbonyl group (methoxycarbonyl, ethoxycarbonyl, phenoxycarbonyl and pyridyloxycarbonyl group); aminocarbonyl group (carbamoyl, methylcarbamoyl, phenylcarbamoyl, pyridylcarbamoyl, carbazoyl, allophanoyl, oxamoyl and succinamoyl group); thiocarboxyl and the salts thereof; dithiocarboxyl and the salts thereof; thiocarbonyl group (methoxythiocarbonyl, methylthiocarbonyl and methylthiothiocarbonyl group); acyl group (formyl, acetyl, propionyl, acryloyl, benzoyl, cinnamoyl, pyridinecarbonyl, thiazolecarbonyl and trifluoroacetyl group); thioacyl group (thioformyl, thioacetyl, thiobenzoyl and pyridinethiocarbonyl); sulfino group and the salts thereof; sulfo group and the salts thereof; sulfinyl group (methylsulfinyl, ethylsulfinyl and phenylsulfinyl group); sulfonyl group (mesyl, ethylsulfonyl, phenylsulfonyl, pyridylsulfonyl, tosyl, tauryl, trifluoromethylsulfonyl, sulfamoyl, methylsulfamoyl, sulfanilyl and acetylsulfanilyl group); oxysulfonyl group (methoxysulfonyl, ethoxysulfonyl, phenoxysulfonyl, acetaminopheoxysulfonyl and pyridyloxysulfonyl group); thiosulfonyl group (methylthiosulfonyl, ethylthiosulfonyl, phenylthiosulfonyl, acetaminophenylthiosulfonyl and pyridylthiosulfonyl group); aminosulfonyl group (sulfamoyl, methylsulfamoyl, dimethylsulfamoyl, ethylsulfamoyl, diethylsulfamoyl, phenylsulfamoyl, acetaminophenylsulfamoyl and pyridylsulfamoyl group); ammonio group (trimethylammonio, ethyldimethylammonio, dimethylsulphenylammonio, pyridinio and quinolinio group); azo group (phenylazo, pyridylazo and thiazolylazo group); azoxy group; alkyl halide group (chloromethyl, bromomethyl, fluoromethyl, dichloromethyl, dibromomethyl, difluoromethyl, trifluoromethyl, pentafluoroethyl and heptafluoropropyl group); organosilicic group (silyl, disilanyl, trimethylsilyl and triphenylsilyl group).

In the developing solution of the present invention for a photosensitive polyimide film, it is more desirable to use a tertiary amine compound as the amine compound. It is particularly desirable to use as the tertiary amine compound at least one compound selected from the group consisting of a substituted or unsubstituted N-substituted imidazole, a substituted or unsubstituted N-substituted morpholine, a substituted or unsubstituted N-substituted pyrroline, a substituted or unsubstituted N-(2-cyanoethyl) piperazine, a substituted or unsubstituted N-propargyl piperazine, a substituted or unsubstituted N-(2-hydroxyethyl) piperazine, a substituted or unsubstituted 2-(N,N-di-substituted amino) propionitrile, a substituted or unsubstituted N,N-di-substituted propargyl amine, a substituted or unsubstituted triethanol amine, a substituted or unsubstituted N-substituted diethanol amine, and a substituted or unsubstituted N,N-di-substituted tris(hydroxymethyl) amino methane. The developing solution containing any of these tertiary amines is excellent in its resolution characteristics and residual film characteristics.

The substituent group at the N-position of these compounds includes, for example, aliphatic hydrocarbon groups given in item (A) above, alicyclic hydrocarbon groups given in item (B) above, aromatic hydrocarbon groups given in item (C) above, heterocyclic groups given in item (D) above, characteristic groups given in item (a) above, substituted aliphatic hydrocarbon groups in which the characteristic group in item (a) is substituted in the aliphatic hydrocarbon groups, substituted alicyclic hydrocarbon groups in which the characteristic group in item (a) is substituted in the alicyclic hydrocarbon groups, substituted aromatic hydrocarbon groups in which the characteristic group in item (a) is substituted in the aromatic hydrocarbon groups, and substituted heterocyclic groups in which the characteristic group in item (a) is substituted in the heterocyclic groups. Particularly, it is desirable to use as the substituent group a hydrocarbon group having 6 or less carbon atoms such as a methyl group, an ethyl group, a propyl group, an isopropyl group, a butyl group, an isobutyl group a sec.-butyl group, a tert.-butyl group, a pentyl group, a tert.-pentyl group, an isopentyl group, a neopentyl group, a hexyl group, an isohexyl group, a cyclopentyl group, a cyclohexyl group, a phenyl group, a hydroxymethyl group, a hydroxyethyl group, a hydroxypropyl group, and a hydroxy butyl group.

The substituent groups for substitution in positions other than N-position include, for example, aliphatic hydrocarbon groups given in item (A) above, alicyclic hydrocarbon groups given in item (B) above, aromatic hydrocarbon groups given in item (C) above, heterocyclic groups given in item (D) above, characteristic groups given in item (a) above, substituted aliphatic hydrocarbon groups in which the characteristic group in item (a) is substituted in the aliphatic hydrocarbon groups, substituted alicyclic hydrocarbon groups in which the characteristic group in item (a) is substituted in the alicyclic hydrocarbon groups, substituted aromatic hydrocarbon groups in which the characteristic group in item (a) is substituted in the aromatic hydrocarbon groups, and substituted heterocyclic groups in which the characteristic group in item (a) is substituted in the heterocyclic groups.

The specific examples of the tertiary amine compounds include, for example, N-methyl imidazole, N-ethyl imidazole, N-(hydroxyethyl)imidazole, N-methylmorpholine, N-ethylmorpholine, N-(hydroxyethyl)morpholine, 2-(dimethylamino) propionitrile, 2-(diethylamino)propionitrile, N,N-dimethylpropargyl amine, N,N-diethyl propargyl amine, triethanol amine, N-methyl diethanol amine, N-ethyl diethanol amine, N,N-dimethyl tris(hydroxymethyl)amino methane, N-methyl-N'-(hydroxyethyl)piperazine, N-ethyl-N'-(hydroxyethyl)piperazine, and N-(hydroxyethyl)-N'-(hydroxyethyl)piperazine. Among these compounds, it is desirable to use at least one tertiary amine compound having pKb of 6 to 7, which is selected from the group consisting of N-substituted imidazole compound, N-substituted morpholine compound, 2-(N,N-disubstituted amino) propionitrile compound, N,N-disubstituted propargyl amine compound and triethanol amine, because these compounds are excellent in the resolution characteristics and the residual film characteristics. The specific compounds of these tertiary amine compounds include, for example, N-methylimidazole, N-ethylimidazole, N-(hydroxyethyl) imidazole, N-methylmorpholine, N-ethylmorpholine, N-(hydroxyethyl)morpholine, 2-(dimethylamino) propionitrile, 2-(diethylamino)propionitrile, N,N-dimethyl propargyl amine, N,N-diethylpropargyl amine, and triethanol amine. It is most desirable to use N-substituted imidazole compounds because the film is unlikely to peel off in the developing step.

For preparing the developing solution of the present invention for a photosensitive polyimide film, it is desirable to dissolve the amine enumerated above in water and to control the amine concentration of the solution at 0.1 to 20% by weight. If the concentration of the amine compound exceeds 20% by weight, the film is markedly corroded in the undissolved portion, leading to poor residual film characteristics. On the other hand, where the concentration of the amine compound is less than 0.1% by weight, it is difficult to dissolve and remove sufficiently the dissolved portion. Incidentally, the concentration of the amine compound in the developing solution of the present invention should desirably fall within a range of between 1% and 10% by weight.

For preparing the developing solution of the present invention, it is desirable to use a pure water or an ultra pure water prepared by deionization with an ion exchange resin in order to prevent contamination with an ionic impurity of a silicon wafer or a substrate for forming a film pattern.

In order to improve the permeability of the developing solution or to control the dissolving speed, it is possible to add to the developing solution of the present invention an alcohol compound, a surfactant, an inorganic alkaline compound (such as sodium hydroxide, potassium hydroxide, sodium carbonate, or potassium carbonate), an organic alkaline compound (such as tetramethyl ammonium hydroxide, choline, triethyl amine, ethanol amine, or diethyl ethanol amine), or an acid compound (such as boric acid, phosphoric acid, carbonic acid, oxime compound, succinimide compound or a phthalimide compound).

The developing solution of the present invention can be used for a photosensitive resin prepared by adding a photosensitive dissolution inhibitor to an alkali soluble resins such as phenolic resin, novolak resin, polyacrylic acid, polyimide precursor (polyamic acid) and benzoxazole precursor and is useful as a developing solution for, particularly, a photosensitive polyimide prepared by adding a photosensitive dissolution inhibitor to the polyimide precursor (polyamic acid).

A method of forming a polyimide film pattern by using the developing solution of the present invention will now be described.

The method of the present invention for forming a polyimide film pattern comprises at least steps (I) to (IV) given below:

(I) The step of coating a substrate surface with a photosensitive polyimide solution of a positive type containing a polyimide precursor and a photosensitive dissolution inhibitor, followed by heating the coating to form a resin layer;

(II) The step of exposing a desired region of the resin layer to light;

(III) The step of developing the resin layer after the light exposure step with the developing solution of the present invention; and (IV) The step of applying a heat treatment to the resin layer after the developing step.

In step (I) noted above, a substrate surface is coated with a solution of a photosensitive polyimide of a positive type by, for example, a spin coating method, followed by heating the coating with a hot plate under temperatures not higher than 160° C. so as to dry the coating and, thus, to form a resin layer. It is desirable to set the heating temperature in the heating-drying step to fall generally within a range of between 70 and 130° C. However, in order to control the dissolution speed on the occasion of the development, it is possible to carry out the heating at 130 to 180° C. to imidize partly the polyimide precursor. Incidentally, it suffices to apply the heating-drying treatment for 0.5 to 60 minutes in general.

The polyimide precursor in the solution of the photosensitive polyimide of a positive type used in step (I) noted above includes polyamic acid, polyamic ester, and a mixture of polyamic acid and polyamic ester. To be more specific, polyimide precursor noted above includes, for example, polyamic acid obtained by the reaction within an organic solvent between tetracarboxylic dianhydride compound and a diamine compound, polyamic ester prepared by esterifying a part or all of the carboxylic group of polyamic acid with a substituted or unsubstituted alkyl group or tetrahydropyranyl group, and a mixture of such a polyamic acid and such a polyamic ester.

It is particularly desirable to use a polyimide precursor (polyamic acid) having a repeating unit represented by general formula (1) given below:

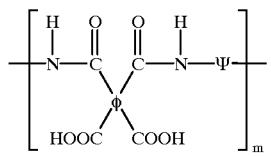

(1)

where φ represents a tetravalent organic group selected from the group consisting of a substituted or unsubstituted aliphatic hydrocarbon group having 1 to 30 carbon atoms, a substituted or unsubstituted alicyclic hydrocarbon group having 1 to 30 carbon atoms, a substituted or unsubstituted aromatic hydrocarbon group having 1 to 30 carbon atoms, a substituted or unsubstituted heterocyclic group having 1 to 30 carbon atoms, and a compound radical having an aliphatic hydrocarbon group, an alicyclic hydrocarbon group, an aromatic hydrocarbon or a heterocyclic group coupled with each other directly or with a crosslinking group interposed therebetween, Ψ represents a divalent organic group selected from the group consisting of a substituted or unsubstituted aliphatic hydrocarbon group having 1 to 30 carbon atoms, a substituted or unsubstituted alicyclic hydrocarbon group having 1 to 30 carbon atoms, a substituted or unsubstituted aromatic hydrocarbon group having 1 to 30 carbon atoms, a substituted or unsubstituted heterocyclic group having 1 to 30 carbon atoms, and a compound radical having an aliphatic hydrocarbon group, an alicyclic hydrocarbon group, an aromatic hydrocarbon or a heterocyclic group coupled with each other directly or with a crosslinking group interposed therebetween, and m is a positive integer.

The polyimide precursor (polyamic acid) represented by general formula (1) can be synthesized by the reaction within an organic solvent between a tetracarboxylic dianhydride represented by general formula (6) given below and a diamine compound represented by general formula (7) given below:

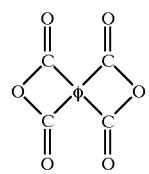

(6)

where φ represents a tetravalent organic group selected from the group consisting of a substituted or unsubstituted aliphatic hydrocarbon group having 1 to 30 carbon atoms, a substituted or unsubstituted alicyclic hydrocarbon group having 1 to 30 carbon atoms, a substituted or unsubstituted aromatic hydrocarbon group having 1 to 30 carbon atoms, a substituted or unsubstituted heterocyclic group having 1 to 30 carbon atoms, and a compound radical having an aliphatic hydrocarbon group, an alicyclic hydrocarbon group, an aromatic hydrocarbon or a heterocyclic group coupled with each other directly or with a crosslinking group interposed therebetween.

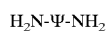

(7)

where Ψ represents a divalent organic group selected from the group consisting of a substituted or unsubstituted aliphatic hydrocarbon group having 1 to 30 carbon atoms, a substituted or unsubstituted alicyclic hydrocarbon group having 1 to 30 carbon atoms, a substituted or unsubstituted aromatic hydrocarbon group having 1 to 30 carbon atoms, a substituted or unsubstituted heterocyclic group having 1 to 30 carbon atoms, and a compound radical having an aliphatic hydrocarbon group, an alicyclic hydrocarbon group, an aromatic hydrocarbon or a heterocyclic group coupled with each other directly or with a crosslinking group interposed therebetween.

Examples of tetracarboxylic dianhydride represented by the general formula (6) are pyromellitic dianhydride, 3-fluoropyromellitic dianhydride, 3,6-difluoropyromellitic dianhydride, 3-(trifluoromethyl) pyromellitic dianhydride, 3,6-bis(trifluoromethyl)pyromellitic dianhydride, 1,2,3,4-benzenetetracarboxylic dianhydride, 3,3',4,4'-benzophenonetetracarboxylic dianhydride, 2,2',3,31-benzophenonetetracarboxylic dianhydride, 3,3',4,4'-biphenyltetracarboxylic dianhydride, 3,3",4,4"-terphenyltetracarboxylic dianhydride, 3,3''',4,4'''-quaterphenyltetracarboxylic dianhydride, 3,3"",4,4""-quinquephenyltetracarboxylic dianhydride, 2,2',3,3'-biphenyltetracarboxylic dianhydride, methylene-4,41-diphthalic dianhydride, 1,1-ethylidene-4,4'-diphthalic dianhydride, 2,2-propylidene-4,4'-diphthalic dianhydride, 1,2-ethylene-4,4'-diphthalic dianhydride, 1,3-trimethylene-4,4'-diphthalic dianhydride, 1,4-tetramethylene-4,4'-diphthalic dianhydride, 1,5-pentamethylene-4,4'-diphthalic dianhydride, 1,1,1,3,3,3-hexafluoro-2,2-propylidene-4,4'-diphthalic dianhydride, difluoromethylene-4,4'-diphthalic dianhydride, 1,1,2,2-tetrafluoro-1,2-ethylene-4,4'-diphthalic dianhydride, 1,1,2,2,3,3-hexafluoro-1,3-trimethylene-4,4'-diphthalic dianhydride, 1,1,2,2,3,3,4,4-octafluoro-1,4-tetramethylene-4,4'-diphthalic dianhydride, 1,1,2,2,3,3,4,4,5,5-decafluoro-1,5-pentamethylene-4,4'-diphthalic dianhydride, oxy-4,4'-diphthalic dianhydride, thio-4,4'-diphthalic dianhydride, sulfonyl-4,4'-diphthalic dianhydride, 1,3-bis(3,4-dicarboxyphenyl)benzene dianhydride, 1,4-bis(3,4-dicarboxyphenyl)benzene dianhydride, 1,3-bis(3,4-dicarboxyphenoxy)benzene dianhydride, 1,4-bis(3,4-dicarboxyphenoxy)benzene dianhydride, 1,3-bis[2-(3,4-dicarboxyphenyl)-2-propyl]benzenedianhydride, 1,4-bis[2-(3,4-dicarboxyphenyl)-2-propyl]benzene dianhydride, bis[3-(3,4-dicarboxyphenoxy)phenyl]methane dianhydride, bis[4-(3,4-dicarboxyphenoxy)phenyl]methane dianhydride, 2,2-bis[3-(3,4-dicarboxyphenoxy)phenyl]propane dianhydride, 2,2-bis[4-(3,4-dicarboxyphenoxy)phenyl]propane dianhydride, 2,2-bis[3-(3,4-dicarboxyphenoxy)phenyl]-1,1,1,3,3,3-hexafluoropropane dianhydride, 2,2-bis[4-(3,4-dicarboxyphenoxy)phenyl]-1,1,1,3,3,3-hexafluoropropane dianhydride, bis(3,4-dicarboxyphenoxy)dimethylsilane dianhydride, 1,3-bis(3,4-dicarboxyphenyl)-1,1,3,3-tetramethyldisiloxane dianhydride, 2,3,6,7-naphthalenetetracarboxylic dianhydride, 1,4,5,8-naphthalenetetracarboxylic dianhydride, 1,2,5,6-naphthalenetetracarboxylic dianhydride, 3,4,9,10-perylenetetracarboxylic dianhydride, 2,3,6,7-anthracenetetracarboxylic dianhydride, 1,2,7,8-phenanthrenetetracarboxylic dianhydride, ethylenetetracarboxylic dianhydride, 1,2,3,4-butane tetracarboxylic dianhydride, 1,2,3,4-cyclobutanetetracarboxylic dianhydride, cyclopentanetetracarboxylic dianhydride, cyclohexane-1,2,3,4-tetracarboxylic dianhydride, cyclohexane-1,2,4,5-tetracarboxylic dianhydride, 3,3',4,4'-bicyclohexyltetracarboxylic dianhydride, carbonyl-4,4'-bis(cyclohexane-1,2-dicarboxylic) dianhydride, methylene-4,4'-bis(cyclohexane-1,2-dicarboxylic) dianhydride, 1,2-ethylene-4,4'-bis(cyclohexane-1,2-dicarboxylic) dianhydride, 1,1-ethylidene-4,4'-bis(cyclohexane-1,2-dicarboxylic) dianhydride, 2,2-propylidene-4,4'-bis(cyclohexane-1,2-dicarboxylic) dianhydride, 1,1,1,3,3,3-hexafluoro-2,2-propylidene-4,4--bis(cyclohexane-1,2-dicarboxylic) dianhydride, oxy-4,4'-bis(cyclohexane-1,2-dicarboxylic) dianhydride, thio-4,41-bis(cyclohexane-1,2-dicarboxylic) dianhydride, sulfonyl-4,4'-bis(cyclohexane-1,2-dicarboxylic) dianhydride, 2,2'-difluoro-3,3',4,4'-biphenyltetracarboxylic dianhydride, 5,5'-difluoro-3,3',4,4'-biphenyltetracarboxylic dianhydride, 6,6'-difluoro-3,3',4,4'-biphenyltetracarboxylic dianhydride, 2,2',5,5',6,6'-hexafluoro-3,3',4,4'-biphenyltetracarboxylic dianhydride, 2,2'-bis(trifluoromethyl)-3,3',4,41-biphenyltetracarboxylic dianhydride, 5,5'-bis(trifluoromethyl)-3,3',4,4'-biphenyltetracarboxylic dianhydride, 6,6'-bis(trifluoromethyl)-3,3',4,4'-biphenyltetracarboxylic dianhydride, 2,2',5,5'-tetrakis(trifluoromethyl)-3,3',4,4-biphenyltetracarboxylic dianhydride, 2,2',6,6'-tetrakis(trifluoromethyl)-3,3',4,4'-biphenyltetracarboxylic dianhydride, 5,5',6,6'-tetrakis(trifluoromethyl)-3,3',4,4'-biphenyltetracarboxylic dianhydride, 2,2',5,5',6,6'-hexakis(trifluoromethyl)-3,3',4,4'-biphenyltetracarboxylic dianhydride, oxy-4,4'-bis(3-fluorophthalic) dianhydride, oxy-4,4'-bis(5-fluorophthalic) dianhydride, oxy-4,4'-bis(6-fluorophthalic) dianhydride, oxy-4,4'-bis(3,5,6-trifluorophthalic) dianhydride, oxy-4,4'-bis[3-(trifluoromethyl) phthalic] dianhydride, oxy-4,4'-bis[5-(trifluoromethyl) phthalic] dianhydride, oxy-4,4'-bis[6-(trifluoromethyl) phthalic] dianhydride, oxy-4,4'-bis[3,5-bis(trifluoromethyl) phthalic] dianhydride, oxy-4,4'-bis[3,6-bis(trifluoromethyl) phthalic] dianhydride, oxy-4,4'-bis[5,6-bis(trifluoromethyl) phthalic] dianhydride, oxy-4,4'-bis[3,5,6-tris(trifluoromethyl) phthalic] dianhydride, sulfonyl-4,4'-bis(3-fluorophthalic) dianhydride, sulfonyl-4,4'-bis(5-fluorophthalic) dianhydride, sulfonyl-4,4'-bis(6-fluorophthalic) dianhydride, sulfonyl-4,4'-bis(3,5,6-trifluorophthalic) dianhydride, sulfonyl-4,4'-bis[3-(trifluoromethyl) phthalic] dianhydride, sulfonyl-4,4'-bis[5-(trifluoromethyl) phthalic] dianhydride, sulfonyl-4,4 '-bis[6-(trifluoromethyl) phthalic] dianhydride, sulfonyl-4,4'-bis[3,5-bis(trifluoromethyl) phthalic] dianhydride, sulfonyl-4,4'-bis[3,6-bis(trifluoromethyl) phthalic] dianhydride, sulfonyl-4,4'-bis[5,6-bis(trifluoromethyl) phthalic] dianhydride, sulfonyl-4,4'-bis[3,5,6-tris(trifluoromethyl) phthalic] dianhydride, 1,1,1,3,3,3-hexafluoro-2,2-propylidene-4,4'-bis(3-fluorophthalic) dianhydride, 1,1,1,3,3,3-hexafluoro-2,2-propylidene-4,4'-bis(5-fluorophthalic) dianhydride, 1,1,1,3,3,3-hexafluoro-2,2-propylidene-4,4'-bis(6-fluorophthalic) dianhydride, 1,1,1,3,3,3-hexafluoro-2,2-propylidene-4,4'-bis(3,5,6-trifluorophthalic) dianhydride, 1,1,1,3,3,3-hexafluoro-2,2-propylidene-4,4'-bis[3-(trifluoromethyl) phthalic] dianhydride, 1,1,1,3,3,3-hexafluoro-2,2-propylidene-4,4'-bis[5-(trifluoromethyl) phthalic] dianhydride, 1,1,1,3,3,3-hexafluoro-2,2-propylidene-4,4'-bis[6-(trifluoromethyl) phthalic] dianhydride, 1,1,1,3,3,3-hexafluoro-2,2-propylidene-4,4'-bis[3,5-bis(trifluoromethyl)phthalic] dianhydride, 1,1,1,3,3,3-hexafluoro-2,2-propylidene-4,4'-bis[3,6-bis(trifluoromethyl) phthalic] dianhydride, 1,1,1,3,3,3-hexafluoro-2,2-propylidene-4,4'-bis[5,6-bis(trifluoromethyl) phthalic] dianhydride, 1,1,1,3,3,3-hexafluoro-2,2-propylidene-4,4'-bis[3,5,6-tris(trifluoromethyl) phthalic] dianhydride, 9-phenyl-9-(trifluoromethyl)xanthene-2,3,6,7-tetracarboxylic dianhydride, 9,9-bis(trifluoromethyl)xanthene-2,3,6,7-tetracarboxylic dianhydride, and bicyclo[2,2,2]oct-7-ene-2,3,5,6-tetracarboxylic dianhydride.

These tetracarboxylic dianhydride can be used singly or in the form of a mixture of at least two of these tetracarboxylic dianhydride.

The tetracarboxylic dianhydride is used in an amount of at least 0.8 molar equivalent, preferably at least 0.9 molar equivalent, of all the acid anhydride components. If the tetracarboxylic dianhydride is used in an amount smaller than the amount noted above, the heat resistance of the resultant polyimide resin is lowered.

Examples of diamine compound represented by the general formula (7) are 1,2-phenylenediamine, 1,3-phenylenediamine, 1,4-phenylenediamine, 3,3'-diaminobiphenyl, 3,4'-diaminobiphenyl, 4,4'-diaminobiphenyl, 3,3"-diaminoterphenyl, 4,4"-diaminoterphenyl, 3,3'''-diaminoquaterphenyl, 4,4'''-diaminoquaterphenyl, 3,3''''-diaminoquinquephenyl, 4,4''''-diaminoquinquephenyl, oxy-3,3'-dianiline, oxy-4,4'-dianiline, thio-3,3'-dianiline, thio-4,4'-dianiline, sulfonyl-3,3'-dianiline, sulfonyl-4,4'-dianiline, methylene-3,3'-dianiline, methylene-4,4'-dianiline, 1,2-ethylene-3,3'-dianiline, 1,2-ethylene-4,4'-dianiline, 1,1-ethylidene-3,3'-dianiline, 1,1-ethylidene-4,4'-dianiline, 1,3-propylene-3,3'-dianiline, 1,3-propylene-4,4'-dianiline, 2,2-propylidene-3,3'-dianiline, 2,2-propylidene-4,4'-dianiline, difluoromethylene-3,3'-dianiline, difluoromethylene-4,4'-dianiline, 1,1,2,2-tetrafluoro-1,2-ethylene-3,3'-dianiline, 1,1,2,2-tetrafluoro-1,2-ethylene-4,4'-dianiline, 2,2,2-trifluoro-1,1-ethylidene-3,3'-dianiline, 2,2,2-trifluoro-1,1-ethylidene-4,4'-dianiline, 1,1,1,3,3,3-hexafluoro-2,2- propylidene-3,3'-dianiline, 1,1,1,3,3,3-hexafluoro-2,2-propylidene-4,4'-dianiline, 1,1,2,2,3,3-hexafluoro-1,3-propylene-3,3'-dianiline, 1,1,2,2,3,3-hexafluoro-1,3-propylene-4,4'-dianiline, 1,3-bis(3-aminophenoxy)benzene, 1,3-bis(4-aminophenoxy)benzene, 1,3-bis(3-aminophenylthio)benzene, 1,3-bis(4-aminophenylthio)benzene, 1,3-bis(3-aminophenylsulfonyl)benzene, 1,3-bis(4-aminophenylsulfonyl)benzene, 1,3-bis[2-(3-aminophenyl)-2-propyl]benzene, 1,3-bis[2-(4-aminophenyl)-2-propyl]benzene, 1,3-bis[2-(3-aminophenyl)-1,1,1,3,3,3-hexafluoro-2-propyl]benzene, 1,3-bis[2-(4-aminophenyl)-1,1,1,3,3,3-hexafluoro-2-propyl]benzene, 1,4-bis(3-aminophenoxy)benzene, 1,4-bis(4-aminophenoxy)benzene, 1,4-bis(3-aminophenylthio)benzene, 1,4-bis(4-aminophenylthio)benzene, 1,4-bis(3-aminophenylsulfonyl)benzene, 1,4-bis(4-aminophenylsulfonyl)benzene, 1,4-bis[2-(3-aminophenyl)-2-propyl]benzene, 1,4-bis[2-(4-aminophenyl)-2-propyl]benzene, 1,4-bis[2-(3-aminophenyl)-1,1,1,3,3,3-hexafluoro-2-propyl]benzene, 1,4-bis[2-(4-aminophenyl)-1,1,1,3,3,3-hexafluoro-2-propyl]benzene, 4,4'-bis(3-aminophenoxy)biphenyl, 4,4'-bis(4-aminophenoxy)biphenyl, bis[4-(3-aminophenoxy)phenyl]ether, bis[4-(4-aminophenoxy)phenyl]ether, bis[4-(3-aminophenoxy)phenyl]sulfone, bis[4-(4-aminophenoxy)phenyl]sulfone, 2,2-bis[4-(3-aminophenoxy)phenyl]propane, 2,2-bis[4-(4-aminophenoxy)phenyl]propane, 2,2-bis[4-(3-aminophenoxy)phenyl-1,1,1,3,3,3-hexafluoropropane, 2,2-bis[4-(4-aminophenoxy)phenyl-1,1,1,3,3,3-hexafluoropropane, 5-fluoro-1,3-phenylenediamine, 2-fluoro-1,4-phenylenediamine, 2,5-difluoro-1,4-phenylenediamine, 2,4,5,6-hexafluoro-1,3-phenylenediamine, 2,3,5,6-hexafluoro-1,4-phenylenediamine, 3,3'-diamino-5,5'-difluorobiphenyl, 4,4'-diamino-2,2'-difluorobiphenyl, 4,4'-diamino-3,3'-difluorobiphenyl, 3,3'-diamino-2,2',4,4',5,5',6,6'-octafluorobiphenyl, 4,4'-diamino-2,2',3,3',5,5',6,6'-octafluorobiphenyl, oxy-5,5'-bis(3-fluoroaniline), oxy-4,4'-bis(2-fluoroaniline), oxy-4,4'-bis(3-fluoroaniline), sulfonyl-5,5'-bis(3-fluoroaniline), sulfonyl-4,4'-bis(2-fluoroaniline), sulfonyl-4,4'-bis(3-fluoroaniline), 1,3-bis(3-aminophenoxy)-5-fluorobenzene, 1,3-bis(3-amino-5-fluorophenoxy)benzene, 1,3-bis(3-amino-5-fluorophenoxy)-5-fluorobenzene, 5-trifluoromethyl-1,3-phenylenediamine, 2-trifluoromethyl-1,4-phenylenediamine, 2,5-bis(trifluoromethyl)-1,4-phenylenediamine, 2,2'-bis(trifluoromethyl)-4,4'-diaminobiphenyl, 3,3'-bis(trifluoromethyl)-4,4'-diaminobiphenyl, oxy-5,5'-bis[3-(trifluoromethyl)aniline], oxy-4,4'-bis[2-(trifluoromethyl)aniline], oxy-4,4'-bis[3-(trifluoromethyl)aniline], sulfonyl-5,5'-bis[3-(trifluoromethyl)aniline], sulfonyl-4,4'-bis[2-(trifluoromethyl)aniline], sulfonyl-4,4'-bis[3-(trifluoromethyl)aniline], 1,3-bis(3-aminophenoxy)-5-(trifluoromethyl)benzene, 1,3-bis[3-amino-5-(trifluoromethyl)phenoxy]benzene, 1,3-bis[3-amino-5-(trifluoromethyl)phenoxy]-5-(trifluoromethyl)benzene, 3,3'-bis(trifluoromethyl)-5,5'-diaminobiphenyl, bis(3-aminophenoxy)dimethylsilane, bis(4-aminophenoxy)dimethylsilane, 1,3-bis(3-aminophenyl)-1,1,3,3-tetramethyldisiloxane, 1,3-bis(4-aminophenyl)-1,1,3,3-tetramethyldisiloxane, methanediamine, 1,2-ethanediamine, 1,3-propanediamine, 1,4-butanediamine, 1,5-pentanediamine, 1,6-hexanediamine, 1,7-heptanediamine, 1,8-octanediamine, 1,9-nonanediamine, 1,10-decanediamine, 1,2-bis(3-aminopropoxy)ethane, 1,3-diaminocyclohexane, 1,4-diaminocyclohexane, bis(3-aminocyclohexyl)methane, bis(4-aminocyclohexyl)methane, 1,2-bis(3-aminocyclohexyl)ethane, 1,2-bis(4-aminocyclohexyl)ethane, 2,2-bis(3-aminocyclohexyl)propane, 2,2-bis(4-aminocyclohexyl)propane, bis(3-aminocyclohexyl) ether, bis(4-aminocyclohexyl) ether, bis(3-aminocyclohexyl)sulfone, bis(4-aminocyclohexyl)sulfone, 2,2-bis(3-aminocyclohexyl)-1,1,1,3,3,3-hexafluoropropane, 2,2-bis(4-aminocyclohexyl)-1,1,1,3,3,3-hexafluoropropane, 1,3-xylylenediamine, 1,4-xylylenediamine, 1,8-diaminonaphthalene, 2,7-diaminonaphthalene, 2,6-diaminonaphthalene, 2,5-diaminopyridine, 2,6-diaminopyridine, 2,5-diaminopyrazine, 2,4-diamino-s-triazine, 1,3-bis(aminomethyl)cyclohexane, 1,4-bis(aminomethyl)cyclohexane, 1,4-bis(3-aminopropyldimethylsilyl)benzene, and 1,3-bis(3-aminopropyl)-1,1,3,3-tetraphenyl disiloxane.

These diamine compounds can be used singly or in the form of a mixture of at least two of these diamine compounds.

It is desirable to use the diamine compound in an amount of at least 0.8 molar equivalent, preferably at least 0.9 molar equivalent, of all the amine compound components. If the diamine compound is used in an amount smaller than the amount noted above, the heat resistance of the resultant polyimide resin is lowered.

It is possible to use a diamine compound represented by general formula (8), i.e., bis (aminoalkyl) peralkyl polysiloxane compound, together with the diamine compounds enumerated above.

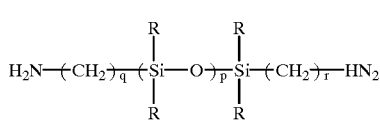

(8)

where R, which may be the same or different, represents an alkyl group having 1 to 5 carbon atoms, each of q and r represents an integer of 1 to 10, and p represents a positive integer.

Examples of a bis(aminoalkyl)peralkyl polysiloxane compound represented by the aforementioned general formula (8) are
1,3-bis(aminomethyl)-1,1,3,3-tetramethyl disiloxane,
1,3-bis(2-aminoethyl)-1,1,3,3-tetramethyl disiloxane, 1,3-bis(3-aminopropyl)-1,1,3,3-tetramethyl disiloxane, 1,3-bis(4-aminobutyl)-1,1,3,3-tetramethyl disiloxane,
1,3-bis(5-aminopentyl)-1,1,3,3-tetramethyl disiloxane, 1,3-bis(6-aminohexyl)-1,1,3,3-tetramethyl disiloxane, 1,3-bis(7-aminoheptyl)-1,1,3,3-tetramethyl disiloxane, 1,3-bis(8-aminooctyl)-1,1,3,3-tetramethyl disiloxane, 1,3-bis(10-aminodecyl)-1,1,3,3-tetramethyl disiloxane,
1,5-bis(3-aminopropyl)-1,1,3,3,5,5-hexamethyl trisiloxane, 1,7-bis(3-aminopropyl)-1,1,3,3,5,5,7,7-octamethyl tetrasiloxane,
1,11-bis(3-aminopropyl)-1,1,3,3,5,5,7,7,9,9,11,11-dodecamethyl hexasiloxane, 1,15-bis(3-aminopropyl)-1,1,3,3,5,5,7,7,9,9,11,11,13,13,15,15-hexadecamethyl octasiloxane, and 1,19-bis(3-aminopropyl)-1,1,3,3,5,5,7,7,9,9,11,11,13,13,15,15,17,17,19,19-eicosamethyl decasiloxane.

The bis (aminoalkyl) peralkyl polysiloxane represented by general formula (8) produces an effect of improving the adhesivity and bonding strength of the polyimide resin to, for example, a glass substrate or a semiconductor substrate such as a silicon substrate. It is desirable to use these compounds in an amount of 0.02 to 0.2 molar equivalent of all the diamine components. Where these compounds are used in an amount noted above, the adhesivity and bonding strength of the resultant polyimide resin to the substrate is improved. However, if these compounds are used in an excessively large amount, the heat resistance of the resultant polyimide resin tends to be lowered.

Further, a dicarboxylic anhydride or monoamine compound can be used in the present invention for controlling the degree of polymerization of the polyamic acid.

Examples of such a dicarboxylic anhydride are maleic anhydride, citraconic anhydride, dimethylmaleic anhydride, ethylmaleic anhydride, diethylmaleic anhydride, propylmaleic anhydride, butylmaleic anhydride, chloromaleic anhydride, dichloromaleic anhydride, bromomaleic anhydride, dibromomaleic anhydride, fluoromaleic anhydride, difluoromaleic anhydride, trifluoromethylmaleic anhydride, bis(trifluoromethyl)maleic anhydride, cyclobutanedicarboxylic anhydride, cyclopentanedicarboxylic anhydride, cyclohexanedicarboxylic anhydride, tetrahydrophthalic anhydride, endomethylenetetrahydrophthalic anhydride, methyltetrahydrophthalic anhydride, methylendomethylenetetrahydrophthalic anhydride, phthalic anhydride, methylphthalic anhydride, ethylphthalic anhydride, dimethylphthalic anhydride, fluorophthalic anhydride, difluorophthalic anhydride, chlorophthalic anhydride, dichlorophthalic anhydride, bromophthalic anhydride, dibromophthalic anhydride, nitrophthalic anhydride, 2,3-benzophenonedicarboxylic anhydride, 3,4-benzophenonedicarboxylic anhydride, 3-phenoxyphthalic anhydride, 4-phenoxyphthalic anhydride, 3-(phenylsulfonyl)phthalic anhydride, 4-(phenylsulfonyl)phthalic anhydride, 2,3-biphenyldicarboxylic anhydride, 3,4-biphenyldicarboxylic anhydride, 1,2-naphthalenedicarboxylic anhydride, 2,3-naphthalenedicarboxylic anhydride, 1,8-naphthalenedicarboxylic anhydride, 1,2-anthracenedicarboxylic anhydride, 2,3-anthracene dicarboxylic anhydride, 1,9-anthracene dicarboxylic anhydride, 2,3-pyridine dicarboxylic anhydride, and 3,4-pyridine dicarboxylic anhydride.

Examples of the monoamine compound are methylamine, ethylamine, propylamine, butylamine, pentylamine, hexylamine, heptylamine, octylamine, 1-(3-aminopropyl)-1,1,3,3,3-pentamethyldisiloxane, vinylamine, allylamine, glycine, alanine, aminobutyric acid, valine, norvaline, isovaline, leucine, norleucine, isoleucine, glutamine, glutamic acid, tryptophan, aminocrotonic acid, aminoacetonitrile, aminopropionitrile, aminocrotononitrile, cyclopropylamine, cyclobutylamine, cyclopentylamine, cyclohexylamine, cycloheptylamine, cyclooctylamine, aminoadamantane, aminobenzocyclobutane, aminocaprolactam, aniline, chloroaniline, dichloroaniline, bromoaniline, dibromoaniline, fluoroaniline, difluoroaniline, nitroaniline, dinitroaniline, toluidine, xylidine, ethylaniline, anisidine, phenetidine, aminoacetanilide, aminoacetophenone, aminobenzoic acid, aminobenzaldehyde, aminobenzonitrile, aminophthalonitrile, aminobenzotrifluoride, aminostyrene, aminostilbene, aminoazobenzene, aminodiphenyl ether, aminodiphenyl sulfone, aminobenzamide, aminobenzensulfonamide, aminophenylmaleimide, aminophenylphthalimide, aminobiphenyl, aminoterphenyl, aminonaphthalene, aminoanthracene, aminoanthraquinone, aminofluorene, aminofluorenone, aminopyrrolidine, aminopiperazine, aminopiperidine, aminohomopiperidine, aminomorpholine, aminobenzodioxole, aminobenzodioxane, aminopyridine, aminopyridazine, aminopyrimidine, aminopyrazine, aminoquinoline, aminocinnoline, aminophthalazine, aminoquinazoline, aminoquinoxaline, aminopyrrole, aminoimidazole, aminopyrazole, aminotriazole, aminooxazole, aminoisoxazole, aminothiazole, aminoisothiazole, aminoindole, aminobenzimidazole, aminoindazole, aminobenzoxazole, aminobenzothiazole, benzylamine, phenethylamine, phenylpropylamine, phenylbutylamine, benzhydrylamine, aminoethyl-1,3-dioxolane, aminoethylpyrrolidine, aminoethylpiperazine, aminoethylpiperidine, aminoethylmorpholine, aminopropylimidazole, and aminopropylcyclohexane.

The mixing ratios of these dicarboxylic anhydride and monoamine compound may be optionally selected taking the end-use and viscosity into consideration. For example, these dicarboxylic anhydride and monoamine compound may be added preferably at a ratio of 0.02 to 0.4 molar equivalent based on tetracarboxylic dianhydride and diamine compounds, respectively.

As for the method of synthesizing the polyamic acid represented by the aforementioned general formula (1), there is not any particular restriction. However, it may be preferable to carry out the polymerization thereof in an organic polar solvent which is free from water and in an inert gas atmosphere.

Examples of such an organic polar solvent which may be employed in this polymerization reaction are N,N-dimethylformamide, N,N-dimethylacetamide, N,N-diethylacetamide, N,N-dimethoxyacetamide, N-methyl-2-pyrrolidinone, N-acetyl-2-pyrrolidinone, N-benzyl-2-pyrrolidinone, 1,3-dimethyl-2-imidazolidinone, hexamethylphosphoric triamide, N-methyl-ε-caprolactam, N-acetyl-ε-caprolactam, 1,2-dimethoxyethane, 1,2-diethoxyethane, bis(2-methoxyethyl) ether, bis(2-ethoxyethyl) ether, 1,2-bis(2-methoxyethoxy) ethane, bis[2-(2-methoxyethoxy)ethyl] ether, 1-acetoxy-2-methoxyethane, 1-acetoxy-2-ethoxyethane, (2-acetoxyethyl)(2-methoxyethyl) ether, (2-acetoxyethyl)(2-ethoxyethyl) ether, methyl 3-methoxypropionate, tetrahydrofuran, 1,3-dioxane, 1,3-dioxolane, 1,4-dioxane, pyrroline, pyridine, picoline, dimethylsulfoxide, sulfolane, γ-butyrolactone, propylene carbonate, phenol, cresol, acetone, methylethyl ketone, methylisobutyl ketone; cyclohexanone and acetonylacetone. These organic solvents may be employed singly or in combination of two or more kinds.

The temperature of this polymerization reaction may be generally in the range of −20 to 10000, preferably in the range of −5 to 300C. There is any particular limitation with respect to the reaction pressure, and hence the reaction can be performed satisfactorily under the normal pressure. The reaction time depends on the kinds of tetracarboxylic dianhydride and also on the kinds of the solvent to be employed in the reaction. Generally, a time period of 1 to 24 hours may be sufficient for the reaction.

The polyamic acid to be obtained in this case should preferably be 0.3 (dL/g) or more, more preferably in the range of 0.3 (dL/g) to 1.5 (dL/g) in inherent viscosity of 0.5 wt % solution of the polyamic acid in N,N-dimethylacetamide. The reason for this is that if the inherent viscosity of the polyamic acid is too low, i.e. if the polymerization degree of the polyamic acid is too low, it is difficult to obtain a polyimide resin having a sufficient heat resistance, whereas if the inherent viscosity of the polyamic acid is too high, i.e. if the polymerization degree of the polyamic acid is too high, the handling of it becomes difficult.

It is desirable to use a polyamic acid synthesized by the reaction within an organic solvent between a tetracarboxylic dianhydride and a diamine compound given below as the polyimide precursor (polyamic acid) represented by general formula (1).

Examples of tetracarboxylic dianhydride are pyromellitic dianhydride, 3,3',4,4'-benzophenonetetracarboxylic dianhydride, 3,3',4,4'-biphenyltetracarboxylic dianhydride, 3,3",4,4"-terphenyltetracarboxylic dianhydride, methylene-4,4'-diphthalic dianhydride, 1,1-ethylidene-4,4'-diphthalic dianhydride, 2,2-propylidene-4,4'-diphthalic dianhydride, 1,1,1,3,3,3-hexafluoro-2,2-propylidene-4,4'-diphthalic dianhydride, oxy-4,41-diphthalic dianhydride, thio-4,4$^1$-diphtalic dianhydride, sulfonyl-4,4'-diphthalic dianhydride, 1,3-bis(3,4-dicarboxyphenyl)-1,1,3,3-tetramethyldisiloxane dianhydride, 2,3,6,7-naphthalenetetracarboxylic dianhydride, 1,4,5,8-naphthalenetetracarboxylic dianhydride, 9-phenyl-9-(trifluoromethyl)xanthene-2,3,6,7-tetracarboxylic dianhydride, and 9,9-bis(trifluoromethyl)xanthene-2,3,6,7-tetracarboxylic dianhydride.

Examples of diamine compound are 1,3-phenylenediamine, 1,4-phenylenediamine, 3,3'-diaminobiphenyl, 3,4'-diaminobiphenyl, 4,4'-diaminobiphenyl, 3,3"-diaminoterphenyl, 4,4"-diaminoterphenyl, oxy-3,3'-dianiline, oxy-3,4'-dianiline, oxy-4,4'-dianiline, sulfonyl-3,3'-dianiline, sulfonyl-4,4'-dianiline, methylene-3,3'-dianiline, methylene-4,4'-dianiline, 2,2-propylidene-3,3'-dianiline, 2,2-propylidene-4,4'-dianiline, 1,1,1,3,3,3-hexafluoro-2,2-propylidene-3,3'-dianiline, 1,1,1,3,3,3-hexafluoro-2,2-propylidene-4,4'-dianiline, 1,1,1,3,3,3-hexafluoro-2,2-propylidene-5,5'-di(2-toluidine), 1,1,1,3,3,3-hexafluoro-2,2-propylidene-4,4'-bis(2-aminophenol), 1,3-bis(3-aminophenoxy)benzene, 1,3-bis(4-aminophenoxy)benzene, 1,3-bis[2-(3-aminophenyl)-2-propyl]benzene, 1,3-bis[2-(4-aminophenyl)-2-propyl]benzene, 1,4-bis(3-aminophenoxy)benzene, 1,4-bis(4-aminophenoxy)benzene, 1,4-bis[2-(3-aminophenyl)-2-propyl]benzene, 1,4-bis[2-(4-aminophenyl)-2-propyl]benzene, 4,4'-bis(3-aminophenoxy)biphenyl, 4,4'-bis(4-aminophenoxy)biphenyl, bis[4-(3-aminophenoxy)phenyl]ether, bis[4-(4-aminophenoxy)phenyl]ether, bis[4-(3-aminophenoxy)phenyl]sulfone, bis[4-(4-aminophenoxy)phenyl]sulfone, 2,2-bis[4-(3-aminophenoxy)phenyl]propane, 2,2-bis[4-(4-aminophenoxy)phenyl]propane, 2,2-bis[4-(3-aminophenoxy)phenyl-1,1,1,3,3,3-hexafluoropropane, 2,2-bis[4-(4-aminophenoxy)phenyl-1,1,1,3,3,3-hexafluoropropane, 5-trifluoromethyl-1,3-phenylenediamine, 2,2'-bis(trifluoromethyl)-4,4--diaminobiphenyl, 3,3'-bis(trifluoromethyl)-4,4'-diaminobiphenyl, oxy-5,5'-bis[3-(trifluoromethyl)aniline], 1,8-diaminonaphthalene, 2,7-diaminonaphthalene, 2,6-diaminonaphthalene, 1,3-bis(3-aminopropyl)-1,1,3,3-tetraphenyl disiloxane, 1,3-bis(3-aminopropyl)-1,1,3,3-tetramethyl disiloxane, 1,5-bis(3-aminopropyl)-1,1,3,3,5,5-hexamethyl trisiloxane, 1,7-bis(3-aminopropyl)-1,1,3,3,5,5,7,7-octamethyl tetrasiloxane, 1,11-bis(3-aminopropyl)-1,1,3,3,5,5,7,7,9,9,11,11-dodecamethyl hexasiloxane, 1,15-bis(3-aminopropyl)-1,1,3,3,5,5,7,7,9,9,11,11,13,13,15,15-hexadecamethyl octasiloxane, and 1,19-bis(3-aminopropyl)-1,1,3,3,5,5,7,7,9,9,11,11,13,13,15,15,17,17,19,19-eicosamethyl decasiloxane.

Particularly, a polyamic acid systhesized by reacting in an organic solvent 1.0 molar equivalent of tetracarboxlic dianhydride given below, 0.8 to 1.2 molar equivalent of diamine compound given below, and 0.02 to 0.2 molar equivalent of siloxane compound given below.

Examples of tetracarboxylic dianhydride used for the synthesis are materials containing at least 0.6 molar equivalent of at least one kind of diphthalic dianhydride derivative selected from the group consisting of 3,3',4,4'-benzophenone tetracarboxylic dianhydride, methylene-4,4'-diphtalic dianhydride, 1,1-ethylidene-4,4'-diphthalic dianhydride, 2,2-propylidene-4,4'-diphthalic dianhydride, 1,1,1,3,3,3-hexafluoro-2,2-propylidene-4,4'-diphthalic dianhydride, oxy-4,4'-diphthalic dianhydride, thio-4,4'-diphthalic dianhydride, sulfonyl-4,4--diphthalic dianhydride, 1,3-bis(3,4-dicarboxyphenyl)-1,1,3,3-tetramethyl disiloxane dianhydride, 9-phenyl-9-(trifluoromethyl)xanthene-2,3,6,7-tetracarboxylic dianhydride, and 9,9-bis(trifluoromethyl)xanthene-2,3,6,7-tetracarboxylic dianhydride.

Examples of diamine compound are materials containing at least 0.6 molar equivalent of at least one kind of a dianiline derivative selected from the group consisting of oxy-3,3'-dianiline, oxy-3,41-dianiline, oxy-4,4'-dianiline, sulfonyl-3,3'-dianiline, sulfonyl-4,4'-dianiline, methylene-3,3'-dianiline, methylene-4,4'-dianiline, 2,2-propylidene-3,3'-dianiline, 2,2-propylidene-4,41-dianiline, 1,1,1,3,3,3-hexafluoro-2,2-propylidene-3,3'-dianiline, 1,1,1,3,3,3-hexafluoro-2,2-propylidene-4,4'-dianiline, 1,1,1,3,3,3-hexafluoro-2,2-propylidene-5,5$^1$-di(2-toluidine), and 1,1,1,3,3,3-hexafluoro-2-2-propylidene-4,4'-bis(2-aminophenol).

The siloxane compounds are materials containing at least 0.02 molar equivalent of at least one compound selected from the group consisting of 1,3-bis(3-aminopropyl)-1,1,3,3-tetramethyl disiloxane, 1,5-bis(3-aminopropyl)-1,1,3,3,5,5-hexamethyl trisiloxane, 1,7-bis(3-aminopropyl)-1,1,3,3,5,5,7,7-octamethyl tetrasiloxane, and 1,11-bis(3-aminopropyl)-1,1,3,3,5,5,7,7,9,9,11,11-dodecamethyl hexasiloxane.

These polyamic acids are excellent in the dissolving speed in the developing solution, the contrast between the light-exposed portion and the non-exposed portion and the bonding strength to the substrate and, thus, are particularly desirable.

The photosensitive dissolution inhibitor used in the photosensitive polyimide of a positive type is a substituted or unsubstituted compound selected from the group consisting of 1,2-naphtoquinone-2-diazide compound such as 1,2-naphthoquinone-2-diazide-4-sulfonic ester compound, 1,2-naphthoquinone-2-diazide-5-sulfonic ester compound, 1,2-naphthoquinone-2-diazide-4-sulfonamide compound, or 1,2-naphthoquinone-2-diazide-sulfonamide compound; 1,2-naphthoquinone-1-diazide compound such as 1,2-naphthoquinone-1-diazide-4-sulfonic ester compound, 1,2-naphthoquinone-1-diazide-5-sulfonic ester compound, 1,2-naphthoquinone-1-diazide-4-sulfonamide compound, or 1,2-naphthoquinone-1-diazide-5-sulfonamide compound; quinoline-3,4-quinone-3-diazide compound; 1,4-naphthoquinone-1-diazide compound; 1,4-benzoquinone-1-diazide compound; 1,4-benzoquinone-1-diazide compound; pyridine-3,4,-quinone-3-diazide compound; and 1,4-dihydro-4-(2-nitrophenyl) pyridine compound (nifedipine, etc.).

It is desirable to use as the photosensitive dissolution inhibitor naphthoquinone diazide sulfonic ester compound or naphthoquinone diazide sulfonic acid amide compound obtained by the reaction between a phenol compound or an aniline compound and naphthoquinone diazide sulfonyl chloride compound.

Specific examples of the naphthoquinone diazide sulfonic ester compound include the compound obtained by the reaction between the phenol compound enumerated in group (E) given below and the naphthoquinone diazide sulfonyl chloride compounds enumerated in group (F) given below, said reaction being carried out within water or an organic solvent in the presence of a basic catalyst such as sodium hydroxide, potassium hydroxide, potassium carbonate or triethyl amine so as to sulfonic acid esterify the hydroxyl group.

On the other hand, the specific examples of the naphthoquinone diazide sulfonic acid amide compound include compounds obtained by the reaction between the aniline compounds enumerated in group (F) given below and the naphthoquinone diazide sulfonyl chloride compounds enumerated in group (G) given below. The reaction is carried out within water or an organic solvent in the presence of a basic catalyst such as sodium hydroxide, potassium hydroxide, potassium carbonate or triethyl amine to subject the amino group to sulfonic acid amidation.

(E) Phenol Compounds:

The phenol compounds noted above include a substituted or unsubstituted compound selected from the group consisting of phenol, pyrocatechol, resorcinol, hydroquinone, benzene triol, benzene tetraol, hydroxybenzyl alcohol, hydroxybenzene dimethanol, hydroxybenzene trimethanol, hydroxyphenetyl alcohol, biphenol, oxydiphenol, thiodiphenol, sulfonyl diphenol, dihydroxy benzophenone, trihydroxy benzophenone, tetrahydroxy benzophenone, methylene diphenol, ethylene diphenol, ethylidene diphenol, propylidene diphenol, butylidene diphenol, pentylidene diphenol, methylpropylidene diphenol, methylpentylidene diphenol, hexafluoropropylidene diphenol, phenyl ethylidene diphenol, cyclopentylidene diphenol, cyclohexylidene diphenol, fluorenylidene diphenol, dimethyl silylene diphenol, tris(hydroxyphenyl)methane, tris(hydroxyphenyl) ethane, tris(hydroxyphenyl)propane, tris(4-hydroxyphenyl) butane, phenyl tris(hydroxyphenyl)methane, cyclohexyl tris (hydroxyphenyl)methane, bis(hydroxyphenyl) (dihydroxyphenyl)methane, bis(hydroxyphenyl) (dihydroxyphenyl)ethane, bis(hydroxyphenyl){ [(hydroxyphenyl)propyl]phenyl}methane, bis (hydroxyphenyl){[(hydroxyphenyl)propyl]phenyl}ethane, bis(hydroxyphenyl){[(hydroxyphenyl)propyl] phenyl}propane, bis(hydroxyphenyl){[(hydroxyphenyl) propyl]phenyl}butane, bis(hydroxyphenyl){ [(hydroxyphenyl)propyl]phenyl}phenylmethane, bis (hydroxyphenyl)cyclohexyl{[(hydroxyphenyl)propyl] phenyl}methane, bis(hydroxyphenoxy)benzene, bis (hydroxyphenylpropyl)benzene, bis(hydroxybenzyl) phenol, bis(hydroxybenzyl)benzene diol, bis (hydroxybenzyl)benzene triol, tris(hydroxybenzyl)benzene diol, tetrakis(hydroxyphenyl)ethane, bis[bis (hydroxyphenyl)methyl]benzene, naphthol, naphthalene diol, naphthalene triol, 3,3-bis(hydroxyphenyl)oxindole, and 3,3-bis(hydroxyphenyl)phthalide.

(F) Aniline Compounds:

The aniline compounds noted above include a substituted or unsubstituted compound selected from the group consisting of aniline, phenylene diamine, benzene triamine, benzene tetraamine, hydroxyaniline, benzidine, oxy dianiline, thio dianiline, sulfonyl dianiline, diamino benzophenone, methylene dianiline, ethylene dianiline, ethylidene dianiline, propylidene dianiline, butylidene dianiline, pentylidene dianiline, methylpropylidene dianiline, methylpentylidene dianiline, hexafluoropropylidene dianiline, phenylethylidene dianiline, cyclopentylidene dianiline, cyclohexylidene dianiline, fluorenylidene dianiline, dimethyl silylene dianiline, tris(aminophenyl)methane, tris(aminophenyl) ethane, tris(aminophenyl)propane, tris(4-aminophenyl) butane, phenyl tris(aminophenyl)methane, cyclohexyl tris (aminophenyl)methane, bis(aminophenyl)benzene, tris (aminophenyl)methane, tris(aminophenyl)ethane, naphthylamine, naphthalene diamine, and naphthalene triamine.

(G) Naphthoquinone Diazide Sulfonyl Chloride Compound:

The naphthoquinone diazide sulfonyl chloride compound used in the present invention include, for example, 1,2-naphthoquinone-2-diazide-4-sulfonyl chloride, 1,2-naphthoquinone-2-diazide-5-sulfonyl chloride, 1,2-naphthoquinone-1-diazide-4-sulfonyl chloride and 1,2-naphthoquinone-1-diazide-5-sulfonyl chloride.

In view of the sensitivity and the resolution, it is desirable to use the naphthoquinone diazide compounds represented by general formulas (2) to (5) given below as the photosensitive dissolution inhibitor.

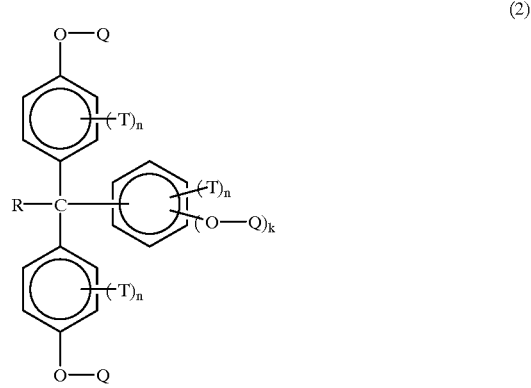

(2)

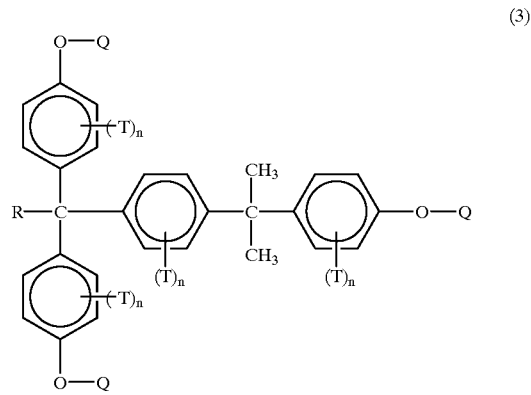

(3)

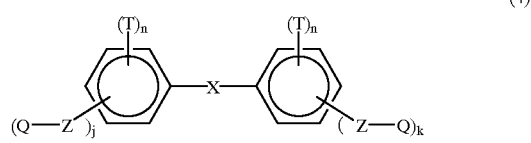

(4)

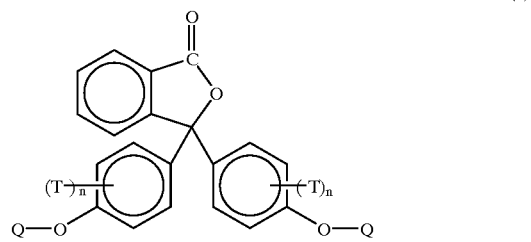

(5)

where Q, which may be the same or different, represents a hydrogen atom, 1,2-naphthoquinone-2-diazide-4-sulfonyl group or 1,2-naphthoquinone-2-diazide-5-sulfonyl group, at least one Q in the general formulas representing 1,2- naphthoquinone-2-diazide-4-sulfonyl group or 1,2-naphthoquinone-2-diazide-5-sulfonyl group, R, which may be the same or different, represents a hydrogen atom, a substituted or unsubstituted aliphatic hydrocarbon group, alicyclic hydrocarbon group, aromatic hydrocarbon group or heterocyclic group, T, which may be the same or different, represents a substituted or unsubstituted aliphatic hydrocarbon group, alicyclic hydrocarbon group, aromatic hydrocarbon group or heterocyclic group, X, which may be the same or different, represents an oxy group, a thio group, a sulfonyl group, a carbonyl group, a methylene group, an ethylidene group, 2,2-propylidene group, 1,1,1,3,3,3-hexafluoro-2,2-propylidene group, 1-phenyl-1,1-ethylidene group, 1,1-cyclohexylidene group, or 9,9-fluorenylidene group, Z, which may be the same or different, represents an oxy group or an imino group, j is an integer of 0 to 3, k, which may be the same or different, is an integer of 1 to 3, and n, which may be the same or different, is an integer of 0 to 4.

The substituent R of the naphthoquinone diazide compounds represented by general formulas (2) to (5) given above, which may be the same or different, represents a hydrogen atom, a substituted or unsubstituted aliphatic hydrocarbon group, alicyclic hydrocarbon group, aromatic hydrocarbon group or heterocyclic group. To be more specific, R represents an aliphatic hydrocarbon group included in group (A) given previously, an alicyclic hydrocarbon group included in group (B) given previously, an aromatic hydrocarbon group included in group (C) given previously, a heterocyclic group included in group (D) given previously, and substituted aliphatic hydrocarbon group, alicyclic hydrocarbon group, aromatic hydrocarbon group or heterocyclic group, in which the characteristic group included in group (a) given previously is substituted in the aliphatic hydrocarbon group, alicyclic hydrocarbon group, aromatic hydrocarbon group or heterocyclic group. Particularly, R in the general formulas (2) to (5) should desirably be a hydrogen atom or a hydrocarbon group having not more than 6 carbon atoms such as methyl, ethyl, propyl, isopropyl, butyl, isobutyl, sec.-butyl, tert.-butyl, pentyl, tert.-pentyl, isopentyl, neopentyl, hexyl, isohexyl, cyclohexyl, cyclopentyl, cyclohexyl, or phenyl.

The substituent T of the naphthoquinone diazide compounds represented by general formulas (2) to (5), which may be the same or different, represents a substituted or unsubstituted aliphatic hydrocarbon group, alicyclic hydrocarbon group, aromatic hydrocarbon group, heterocyclic group, or a characteristic group.

The substituent T of the naphthoquinone diazide sulfonic ester compounds or the naphthoquinone diazide sulfonic acid amide compounds represented by general formulas (2) to (5), which may be the same or different, represents a substituted or unsubstituted aliphatic hydrocarbon group, alicyclic hydrocarbon group, aromatic hydrocarbon group, heterocyclic group, or a characteristic group, or to be more specific, the aliphatic hydrocarbon groups included in the group (A) given previously, the alicyclic hydrocarbon group included in group (B) given previously, the aromatic hydrocarbon group included in the group (C) given previously, the heterocyclic group included in the group (D) given previously, the characteristic group included in group (a) given previously, and the substituted aliphatic hydrocarbon group, the substituted alicyclic hydrocarbon group, the substituted aromatic hydrocarbon group, or the substituted heterocyclic group, in which the characteristic group included in group (a) is substituted in the aliphatic hydrocarbon group, the alicyclic hydrocarbon group, the aromatic hydrocarbon group, or the heterocyclic group. Particularly, it is desirable for the substituent T to be a hydrocarbon group having not more than 6 carbon atoms such as methyl, ethyl, propyl, isopropyl, butyl, isobutyl, sec.-butyl, tert.-butyl, pentyl, tert.-pentyl, isopentyl, neopentyl, hexyl, isohexyl, cyclopentyl, cyclohexyl, or phenyl.

The specific examples of the naphthoquinone diazide compounds represented by general formulas (2) to (5) includes the compounds obtained by the reaction between the phenol compounds included in group (H) given below or the aniline compounds included in group (I) given below and 1,2-naphthoquinone-2-diazide-4-sulfonyl chloride or 1,2-naphthoquinone-2-diazide-5-sulfonyl chloride.

The reaction is carried out within water or an organic solvent in the presence of a basic catalyst so as to subject the hydroxyl group or amino group to sulfonic acid esterification or sulfonic acid amidation.

The basic catalyst used in the reaction includes, for example, sodium hydroxide, potassium hydroxide, potassium carbonate, and triethyl amine.

It is desirable to introduce the naphthoquinone diazide sulfonyl group into the substituent T included in the general formula in an amount of at least 40 mol % in view of the dissolution inhibiting effect.

(H) Phenol Compounds:

The phenol compounds used in the reaction include, for example, tris(4-hydroxyphenyl)methane, 1,1,1-tris(4-hydroxyphenyl)ethane, 1,1,1-tris(4-hydroxyphenyl)propane, 1,1,1-tris(4-hydroxyphenyl)butane, phenyl-tris(4-hydroxyphenyl)methane, cyclohexyl-tris(4-hydroxyphenyl)methane, tris(4-hydroxy-2-methylphenyl)methane, 1,1,1-tris(4-hydroxy-2-methylphenyl)ethane, tris(4-hydroxy-3-methylphenyl)methane, 1,1,1-tris(4-hydroxy-3-methylphenyl)ethane, bis(4-hydroxyphenyl)(2-hydroxyphenyl)methane, bis(4-hydroxyphenyl)(3-hydroxyphenyl)methane, bis(4-hydroxyphenyl)(3,4-dihydroxyphenyl)methane, bis(4-hydroxy-2-methylphenyl)(2-hydroxyphenyl)methane, bis(4-hydroxy-2-methylphenyl)(3-hydroxyphenyl)methane, bis(4-hydroxy-2-methylphenyl)(4-hydroxyphenyl)methane, bis(4-hydroxy-2-methylphenyl)(3,4-dihydroxyphenyl)methane, bis(4-hydroxy-3-methylphenyl)(2-hydroxyphenyl)methane, bis(4-hydroxy-3-methylphenyl)(3-hydroxyphenyl)methane, bis(4-hydroxy-3-methylphenyl)(4-hydroxyphenyl)methane, bis(4-hydroxy-3-methylphenyl)(3,4-dihydroxyphenyl)methane, bis(4-hydroxy-3,5-dimethylphenyl)(2-hydroxyphenyl)methane, bis(4-hydroxy-3,5-dimethylphenyl)(3-hydroxyphenyl)methane, bis(4-hydroxy-3,5-dimethylphenyl)(4-dihydroxyphenyl)methane, bis(4-hydroxy-3,5-dimethylphenyl)(3,4-dihydroxyphenyl)methane, bis(4-hydroxy-3-isopropylphenyl)(2-hydroxyphenyl)methane, bis(4-hydroxy-3-isopropylphenyl)(3-hydroxyphenyl)methane, bis(4-hydroxy-3-isopropylphenyl)(4-hydroxyphenyl)methane, bis(4-hydroxy-3-isopropylphenyl)(3,4-dihydroxyphenyl)methane, bis(4-hydroxy-3-t-butylphenyl)(2-hydroxyphenyl)methane, bis(4-hydroxy-3-t-butylphenyl)(3-hydroxyphenyl)methane, bis(4-hydroxy-3-t-butylphenyl)(4-hydroxyphenyl)methane, bis(4-hydroxy-3-t-butylphenyl)(3,4-dihydroxyphenyl)methane, bis(4-hydroxy-3-cyclohexylphenyl)(2-hydroxyphenyl)methane, bis(4-hydroxy-3-cyclohexylphenyl)(3-hydroxyphenyl)methane, bis(4-hydroxy-3-cyclohexylphenyl)(4-hydroxyphenyl)methane, bis(4-hydroxy-3-cyclohexylphenyl)(3,4-dihydroxyphenyl)methane, bis(4-hydroxy-5-cyclohexylphenyl-2-methylphenyl)(2-hydroxyphenyl)methane, bis(4-hydroxy-5-cyclohexyl-2-methylphenyl)(3-hydroxyphenyl)methane, bis(4-hydroxy-5-cyclohexy-2- methylphenyl)(4-hydroxyphenyl)methane, bis(4-hydroxy-5-cyclohexyl-2-methylphenyl)(3,4-dihydroxyphenyl)methane, bis(4-hydroxy-2,3,5-trimethylphenyl)(2-hydroxyphenyl)methane, bis(4-hydroxy-2,3,5-trimethylphenyl)(3-hydroxyphenyl)methane, bis(4-hydroxy-2,3,5-trimethylphenyl)(4-hydroxyphenyl)methane, bis(4-hydroxy-2,3,5-trimethylphenyl)(3,4-dihydroxyphenyl)methane, bis(4-hydroxyphenyl){4-[2-(4-hydroxyphenyl)-2-propyl]phenyl}methane, 1,1-bis(4-hydroxyphenyl)-1-{4-[2-(4-hydroxyphenyl)-2-propyl]phenyl}ethane, 1,1-bis(4-hydroxyphenyl)-1-{4-[2-(4-hydroxyphenyl)-2-propyl]phenyl}propane, 1,1-bis(4-hydroxyphenyl)-1-{4-[2-(4-hydroxyphenyl)-2-propyl]phenyl}butane, 1,1-bis(4-hydroxyphenyl)-1-{4-[2-(4-hydroxyphenyl)-2-propyl]phenyl}-1-phenylmethane, 1,1-bis(4-hydroxyphenyl)-1-cyclohexyl-1-{4-[2-(4-hydroxyphenyl)-2-propyl]phenyl}methane, oxy-4,4'-diphenol, thio-4,4'-diphenol, sulfonyl-4,4'-diphenol, methylene-4,4'-diphenol, 1,1-ethylidene-4,4'-diphenol, 2,2-propylidene-4,4'-diphenol, 1,1,1,3,3,3-hexafluoro-2,2-propylidene-4,4'-diphenol, 1-phenyl-1,1-ethylidene-4,4'-diphenol, 2,2-propylidene-4,4'-bis(2-methylphenol), 2,2-propylidene-4,4'-bis(3-methylphenol), 2,2-propylidene-4,4'-bis(3,5-dimethylphenol), 2,2-propylidene-4,4'-bis(3-isopropylphenol), 2,2-propylidene-4,4'-bis(3-t-butylphenol), 2,2-propylidene-4,4'-bis(3-cyclohexylphenol), 2,2-propylidene-4,4'-bis(3-phenylphenol), cyclohexylidene-4,4'-diphenol, cyclohexylidene-4,4'-bis(2-methylphenol), cyclohexylidene-4,4'-bis(3-methylphenol), cyclohexylidene-4,4'-bis(3,5-dimethylphenol), cyclohexylidene-4,4'-bis(3-isopropylphenol), cyclohexylidene-4,4'-bis(3-t-butylphenol), cyclohexylidene-4,4'-bis(3-cyclohexylphenol), cyclohexylidene-4,4'-bis(3-phenylphenol), 9,9-flurorenylidene-4,4'-diphenol, 4,4,-dihydroxy benzophenone, 2,3,4-trihydroxy benzophenone, 2,4,4'-trihydroxy benzophenone, 2,3,4,4--tetrahydroxy benzophenone, 3,3-bis(4-hydroxyphenyl)phthalide, 3,3-bis(4-hydroxy-2-methylphenyl)phthalide, and 3,3-bis(4-hydroxy-3-methylphenyl)phthalide.

(I) Aniline Compound:

The aniline compounds used in the reaction include, for example, oxy-3,3-dianiline, oxy-3,4-dianiline, oxy-4,4-dianiline, thio-4,4-dianiline, sulfonyl-3,3-dianiline, sulfonyl-4,4-dianiline, 3,3-diamino benzophenone, 4,4-diamino benzophenone, methylene-4,4-dianiline, 2,2-propylidene-4,4-dianiline, 1,1,1,3,3,3-hexafluoro-2,2-propylidene-3,3-dianiline, 1,1,1,3,3,3-hexafluoro-2,2-propylidene-4,4-dianiline, 1,1,1,3,3,3-hexafluoro-2,2-propylidene-5,5-bis(2-methylaniline), phenylethylidene-4,4-dianiline, cyclohexylidene-4,4-dianiline, and 9,9-fluorenylidene-4,4-dianiline.

In view of the dissolution inhibiting properties and the light transmitting properties, the naphthoquinone diazide compound used in the present invention should desirably be consist of 1,2-naphthoquinone diazide-5-sulfonic ester compound or 1,2-naphthoquinone diazide-5-sulfonic acid amide compound having an average introduction rate of at least 50 mol % and synthesized by the reaction between the phenol compound or aniline compound given below with 1,2-naphthoquinone diazide-5-sulfonyl chloride compound. The term average introduction rate noted above denotes the introduction rate of 1,2-naphthoquinone diazide-5-sulfonyl group in the substituent Q included in the general formulas.

The phenol compounds noted above include, for example, tris(4-hydroxyphenyl) methane, 1,1,1-tris(4-hydroxyphenyl)ethane, bis(4-hydroxyphenyl)(3,4-dihydroxyphenyl)methane, bis(4-hydroxy-5-cyclohexyl-2-methylphenyl)(2-hydroxyphenyl)methane, bis(4-hydroxy-5-cyclohexyl-2-methylphenyl)(3-hydroxyphenyl)methane, bis(4-hydroxy-5-cyclohexyl-2-methylphenyl)(4-hydroxyphenyl)methane, bis(4-hydroxy-5-cyclohexyl-2-methylphenyl)(3,4-dihydroxyphenyl)methane, bis(4-hydroxyphenyl){4-[2-(4-hydroxyphenyl)-2-propyl]phenyl}methane, 1,1-bis(4-hydroxyphenyl)-1-{4-[2-(4-hydroxyphenyl)-2-propyl]phenyl}ethane, 2,2-propyliden-4,4'-diphenol, 1,1,1,3,3,3-hexafluoro-2,2-propyliden-4,4'-diphenol, 3,3-bis(4-hydroxyphenyl)phthalide, 3,3-bis(4-hydroxy-2-methylphenyl)phthalide, and 3,3-bis(4-hydroxy-3-methylphenyl) phthalide.

On the other hand, the aniline compounds noted above include, for example, oxy-3,3-dianiline, oxy-3,4-dianiline, oxy-4,4-dianiline, sulfonyl-3,3-dianiline, sulfonyl-4,4-dianiline, 2,2-propylidene-4,4-dianiline, 1,1,1,3,3,3-hexafluoro-2,2-propylidene-3,3-dianiline, 1,1,1,3,3,3-hexafluoro-2,2-propylidene-4,4-dianiline, 1,1,1,3,3,3-hexafluoro-2,2-propylidene-5,5-bis(2-methylaniline), cyclohexylidene-4,4-dianiline, and 9,9-fluorenylidene-4,4-dianiline.

It is possible to use as desired a photosensitizer in the solution of the photosensitive polyimide of a positive type for increasing the sensitivity of the solution. The photosensitizer used in the present invention includes, for example, acetophenone, benzophenone, benzoin, 2-methylbenzoin, benzoin isopropyl ether, anthrone, 1,9-benzoanthrone, anthracene, phenanthrene quinone, pyrene-1,6-quinone, 9-fluorenone, 1,2-benzoanthraquinone, anthanthrone, 2-chlorobenzanthraquinone, 2-bromobenzanthraquinone, 2-chloro-1,8-phthaloylnaphthalene, Michler's ketone, 4,4'-bis(diethylamino)benzophenone, benzoin methylether, benzyl dimethylketal, 2-methyl-1-[4-(methylthio)phenyl]-2-morpholino-1-propanone, 1-hydroxycyclohexyl phenylketone, ethyl N,N-dimethylamino benzoate, acridine, cyanoacridine, nitropyrene, 1,8-dinitropyrene, 5-nitroacenaphthene, 2-nitrofluorene, 2-t-buryl-9,10-anthraquinone, and N-phenyl maleimide.

These photosensitizers are used singly or in the form of a mixture of at least two compounds thereof in an amount of at least 0.01% by weight, preferably 0.1 to 20% by weight, based on the amount of the polyimide precursor. If the amount of the photosensitizer fails fall within the range specified in the present invention, adverse effects are given to the developing properties and the film forming properties.

Also, it is possible to add, as desired, a dye, a surfactant and an alkali soluble resin to the solution of the photosensitive polyimide of a positive type.

In preparing the solution of the photosensitive polyimide of a positive type, a photosensitive dissolution inhibitor is dissolved first in a solution of the polyimide precursor, followed by diluting the solution as desired with a suitable organic solvent. Further, a photosensitizer, a dye, a surfactant, an alkali soluble resin are dissolved, as desired, in the resultant solution, followed by removing fine impurities by, for example, filtration, if necessary. It is desirable to add the photosensitive dissolution inhibitor in an amount of 1 to 50% by weight, preferably 10 to 40% by weight, based on the amount of the polyimide precursor.

The organic solvent used in the present invention includes, for example, N,N-dimethylformamide, N,N-dimethylacetamide, N,N-diethylacetamide, N,N-dimethoxyacetamide, N-methyl-2-pyrrolidone, N-acetyl-2-pyrrolidone, N-benzyl-2-pyrrolidone, 1,3-dimethyl-2-imidazolidinone, hexamethylphosphoric triamide, N-methyl-ε-caprolactam, N-acetyl-ε-caprolactam, 1,2-dimethoxyethane, 1,2-diethoxyethane, bis(2-methoxy ethyl) ether, bis(2-ethoxyethyl)ether, 1,2-bis(2-methoxy ethoxy) ethane, bis([2-(2-methoxyethoxy)ethyl]ether, polyimide of a positive type.

In step (II) described previously, the resin layer is irradiated with an energy ray such as a visible light, an infrared ray, an ultraviolet light, EB or an X-ray through a photo mask having a predetermined pattern so as to expose a desired region of the resin layer to light. Any of contact light exposure and projecting light exposure can be employed in this light exposure step.

Incidentally, it is possible to apply as desired a PEB (post-exposure baking) using, for example, a hot plate during or after the light exposure step in order to improve the resolution characteristics. It is desirable to apply PEB at about 80 to 160° C. for about 10 seconds to 10 minutes.

In step (III) described previously, the resin layer is developed with the developing solution of the present invention for a photosensitive polyimide after the light exposure step (or after the PEB step, as desired). The light-exposed portion of the resin layer is dissolved and removed by the developing treatment so as to form a desired pattern of a positive type. The developing treatment is performed by, for example, an immersion method, a spray developing method or a paddle developing method.

After the developing step, it is desirable to apply a rinsing treatment with water, alcohol, 1-acetoxy-2-methoxyethane, 1-acetoxy-2-etoxyethane, (2-acetoxyethyl)(2-methoxyethyl) ether, (2-acetoxyethyl)(2-ethoxyethyl)ether, methyl 3-methoxypropionate, tetrahydrofuran, 1,3-dioxane, 1,3-dioxolane, 1,4-dioxolane, pyrroline, pyridine, picoline, dimethylsulfoxide, sulfolane, γ-butyrolactone, propylene carbonate, phenol, cresol, acetone, methylethylketone, methylisobutylketone, cyclohexanone, and acetonitrile. These organic solvents can be used singly or in the form of a mixture of at least two of these compounds.

It is desirable to prepare the solution of the photosensitive polyimide of a positive type as follows. In the first step, the naphthoquinone compound represented by general formulas (2) to (5) is added to the solution of polyamic acid represented by general formula (1), followed by stirring the solution with a mechanical stirrer, a magnetic stirrer, a reciprocating shaker, a mix rotor, etc. It is possible to dilute the solution with a suitable solvent, if necessary. The addition amount of the naphthoquinone diazide compound is 1 to 50% by weight based on the amount of the polyimide precursor. Further, a photosensitizer, a dye, a surfactant, an alkali soluble resin are added and dissolved, as desired, followed by removing the fine impurities by, for example, filtration, as desired, so as to prepare a solution of the photosensitive water-alcohol mixed solution, etc. for removing the residual developing solution.

In step (IV) described previously, a heat treatment is applied after the developing step to the resin layer having a pattern formed thereon at 120 to 450° C. by using a hot plate or an oven so as to dry the developing solution or the rinsing solution, to convert the polyimide precursor into a polyimide film by imidization under heat and to thermally decompose and remove the photosensitive dissolution inhibitor. Incidentally, where the heat treatment is applied at a high temperature, e.g., not lower than 300° C., it is desirable to apply the heat treatment under vacuum or in the presence of an inert gas stream such as a nitrogen gas stream or an argon gas stream so as to prevent the polyimide film from being thermally oxidized.

The electronic part of the present invention is featured in that the electronic part comprises the polyimide film obtained by the pattern forming method of the polyimide film described above as an insulating member, a protective film member, a liquid crystal element member or an optical element member. The particular electronic part includes, for example, an LSI device in which an interlayer insulating film includes a multi-wiring layer formed of a polymer resin such as polyimide and interposed between conductor layers or semiconductor layers, a semiconductor device using a passivation film made of a polymer resin such as polyimide as a humidity resistant insulating protective layer interposed between conductor layers or semiconductor layers, an electronic part using a polymer resin such as polyimide for forming an insulating protective film interposed between conductor layers or semiconductor layers, as electronic part in which an insulating protective layer made of a polymer resin such as polyimide is interposed between a silicon wafer and a wiring layer or between adjacent wiring layers, a thin film magnetic head in which an insulating protective film made of a polymer film such as polyimide is interposed between the substrate material and the wiring layer or between the adjacent wiring layers, a high density printed circuit board in which an insulating protective layer made of a polymer resin such as polyimide is interposed between the substrate material and the wiring layer or between the adjacent wiring layers, a magnetic bubble memory in which an insulating protective layer made of a polymer resin such as polyimide is interposed between the substrate material and the wiring layer or between the adjacent wiring layers, a solar battery in which an insulating protective layer made of a polymer resin such as polyimide is interposed between the substrate material and the wiring layer or between the adjacent wiring layers, and an optical element using a polymer resin such as polyimide as an optical waveguide.

The present invention will now be described based on specific examples of the present invention. However, these examples should not be construed as limiting the present invention.

(1) Synthesis of Polyamic Acid:

Polyamic acid was synthesized as follows by using raw materials mixed together at a predetermined mixing ratio (shown in molar equivalent) as shown in the following Table 1. First of all, 50 ml of N,N-dimethylacetamide was placed under an argon gas atmosphere into a separable flask cooled down to −5 to 5° C. by using a cooling medium. Then, a predetermined amount of tetracarboxylic dianhydride compound was added to the flask and dissolved with stirring to obtain a solution. Subsequently, a predetermined amount of diamine compound was dissolved in 50 ml of N,N-dimethylacetamide to obtain a solution, which was then slowly dripped into the first mentioned solution by means of a dropping funnel provided with a pressure balance tube and stirred for 4 hours. Then, the resultant solution was further stirred at room temperature to obtain a desired polyamic acid.

Then, the inherent viscosity of a 0.5 wt % solution of each of these polyamic acids in N,N-dimethylacetamide was measured at a temperature of 30° C., the results being shown in Table 1.

TABLE 1

|  | PAA1 | PAA2 | PAA3 | PAA4 | PAA5 | PAA6 | PAA7 | PAA8 |
|---|---|---|---|---|---|---|---|---|
| BNTA | 1.00 | — | — | 1.00 | — | — | — | — |
| ODPA | — | 1.00 | — | — | — | 1.00 | — | — |
| 6FPA | — | — | 1.00 | — | 1.00 | — | 1.00 | — |
| P M A | — | — | — | — | — | — | — | 1.00 |
| O D A | 0.95 | 0.95 | 0.95 | — | — | — | 0.75 | 0.95 |
| SNDA | — | — | — | 0.95 | 0.95 | — | — | — |
| 6FDA | — | — | — | — | — | 0.95 | 0.20 | — |
| TSDA | 0.05 | 0.05 | 0.05 | 0.05 | 0.05 | 0.05 | 0.05 | 0.05 |
| Solvent | DMAC | DMAC | DMAC | DMAC | DMAC | DMAC | DMAC | DMAC |
| Concentration wt % | 20.18 | 20.42 | 20.35 | 19.55 | 20.63 | 19.24 | 20.65 | 18.20 |
| Inherent viscosity*) [dL/g] | 0.98 | 0.82 | 0.68 | 0.92 | 0.60 | 0.94 | 0.66 | 1.10 |

*)0.5 wt % DMAC solution, Measuring temperature: 30° C.

The tetracarboxylic dianhydride compounds, diamine compounds and the solvent employed and shown in abbreviation in Table 1 are as follows.
(Tetracarboxylic Dianhydride Compound)
 BNTA: 3,3',4,4'-benzophenonetetracarboxylic dianhydride.
 ODPA: oxy-4,4'-diphtalic dianhydride.
 6FPA : 1,1,1,3,3,3-hexafluoro-2,2-propylidene-4,4'-diphthalic dianhydride.
 PMA: Pyromellitic dianhydride.
(Diamine Compound)
 ODA: Oxy-4,4'-dianiline.
 SNDA: Sulfonyl-3,3'-dianiline.
 6FDA: 1,1,1,3,3,3-hexafluoro-2,2-propylidene-4,4'-dianiline.
 TSDA: 1,3-bis(3-aminopropyl)-1,1,3,3-tetramethyldisiloxane.
(Solvent)
 DMAC: N,N-dimethylacetamide.
(2) Preparation of Photosensitive Polyimide Solution of Positive Type:
 The photosensitive dissolution inhibitor shown in Table 2 was added to the synthesized polyamic acid solution shown in Table 1 at a predetermined mixing ratio denoted by % by weight based on the polyamic acid. The mixed system was stirred at room temperature with a mixing rotor until the mixture was made uniform. Then, the resultant mixture was filtered by a membrane filter having pores sized at 0.2 μm so as to obtain a desired photosensitive polyimide solution of a positive type.

TABLE 2

| Photo-sensitive polyimide | Polyamic acid solution | Photo-sensitive dissolution inhibitor | Addition amount (wt %) |
|---|---|---|---|
| PPI1 | PAA1 | PS-1 | 20.0 |
| PPI2 | PAA2 | PS-1 | 20.0 |
| PPI3 | PAA3 | PS-1 | 20.0 |
| PPI4 | PAA4 | PS-1 | 20.0 |
| PPI5 | PAA5 | PS-1 | 20.0 |
| PPI6 | PAA6 | PS-1 | 20.0 |
| PPI7 | PAA7 | PS-1 | 20.0 |
| PPI8 | PAA1 | PS-2 | 20.0 |
| PPI9 | PAA2 | PS-2 | 20.0 |
| PPI10 | PAA3 | PS-2 | 20.0 |
| PPI11 | PAA4 | PS-2 | 20.0 |
| PPI12 | PAA7 | PS-2 | 20.0 |
| PPI13 | PAA3 | PS-3 | 20.0 |
| PPI14 | PAA4 | PS-3 | 20.0 |
| PPI15 | PAA7 | PS-3 | 20.0 |
| PPI16 | PAA3 | PS-4 | 20.0 |
| PPI17 | PAA4 | PS-4 | 20.0 |
| PPI18 | PAA7 | PS-4 | 20.0 |
| PPI19 | PAA3 | PS-5 | 20.0 |
| PPI20 | PAA7 | PS-5 | 20.0 |

*)wt % based on polyamic acid

The abbreviations of the photosensitive dissolution inhibitors shown in Table 2 represent the compounds given below:
 PS-1: reaction compound between tris(4-hydroxyphenyl)methane and NAC5 (1,2-naphthoquinone-2-diazide-5-sulfonylchloride (average introduction rate of naphthoquinone diazide sulfonyl group relative to the phenolic OH group: 70 mol %);
 PS-2: reaction compound between 1,1-bis(4-hydroxyphenyl)-1-{4-[2-(4-hydrozyphenyl)-2-propyl]phenyl}ethane and NAC5 (average introduction rate of naphthoquinone diazide sulfonyl group relative to the phenolic OH group: 70 mol %);
 PS-3: reaction compound between 1,1,1,3,3,3-hexafluoro-2,2-propylidene-4,4-diphenol and NAC5 (average introduction rate of naphthoquinone diazide sulfonyl group relative to the phenolic OH group: 100 mol %);
 PS-4: reaction compound between 3,3-bis(4-hydroxyphenyl)phthalide and NAC5 (average introduction rate of naphthoquinone diazide sulfonyl group relative to the phenolic OH group: 100 mol %);
 PS-5: reaction compound between oxy-4,4'-dianiline and NAC5 (average introduction rate of naphthoquinone diazide sulfonyl group relative to NH$_2$ group: 100 mol %).
(3) Preparation of Developing Solution:
 The basic compounds shown in Table 3 were dissolved in and diluted by an ion exchange water to a predetermined concentration (denoted by concentration by weight and molar concentration), followed by filtering the resultant diluted solution with a membrane filter having pores of 0.2 μm so as to obtain desired aqueous solutions of the developing solution (DEV-1 to DEV-15). For comparison, aqueous solutions of basic compounds [weakly basic amines (WAM-1 to WAM-3), strongly basic amines (SAM-1 to SAM-9) and inorganic alkaline salts (ALK-1 to ALK-3)], which fails to fall within the scope of the present invention, were also prepared by the similar method.

TABLE 3

| Developing solution | Basic compound | Base dissociation index pkb*) | Weight concentration (wt %) | Molar concentration (mol/L) | pH (20° C.) |
|---|---|---|---|---|---|
| DEV-1 | N-methyl imidazole | 6.87 | 1.64 | 0.200 | 10.39 |
| DEV-2 | N-methyl morpholine | 6.59 | 2.02 | 0.200 | 10.49 |
| DEV-3 | 5-methyl-3,4-dihydro-2H-pyrrole [2-methyl-1-pyroline] | 6.09 | 1.66 | 0.200 | 10.77 |
| DEV-4 | 2-(dimethyl amino) propionitrile | 6.35 | 1.96 | 0.200 | 10.59 |
| DEV-5 | triethanol amine | 6.24 | 2.98 | 0.200 | 10.72 |
| DEV-6 | N-methyl diethanol amine | 5.48 | 2.38 | 0.200 | 11.11 |
| DEV-7 | N-ethyl imidazole | 6.67 | 1.92 | 0.200 | 10.42 |
| DEV-8 | N-methyl imidazole | 6.87 | 2.00 | 0.244 | 10.43 |
| DEV-9 | N-methyl morpholine | 6.59 | 2.00 | 0.198 | 10.48 |
| DEV-10 | triethanol amine | 6.24 | 2.00 | 0.134 | 10.61 |
| DEV-11 | N-methyl diethanol amine | 5.48 | 2.00 | 0.168 | 11.06 |
| DEV-12 | N-methyl imidazole | 6.87 | 3.00 | 0.366 | 10.46 |
| DEV-13 | N-methyl morpholine | 6.59 | 3.00 | 0.297 | 10.52 |
| DEV-14 | triethanol amine | 6.24 | 3.00 | 0.201 | 10.72 |
| DEV-15 | N-methyl diethanol amine | 5.48 | 3.00 | 0.252 | 11.16 |
| WAM-1 | N,N-dimethyl aniline | 8.88 | 2.42 | 0.200 | 9.25 |
| WAM-2 | pyridine | 8.83 | 1.58 | 0.200 | 9.30 |
| WAM-3 | N-methyl benzoimidazole | 8.43 | 2.64 | 0.200 | 9.50 |
| SAM-1 | 2-amino ethanol | 4.50 | 1.22 | 0.200 | 11.67 |
| SAM-2 | 2-(diethylamino) ethanol | 3.90 | 2.34 | 0.200 | 11.82 |
| SAM-3 | triethyl amine | 3.29 | 2.02 | 0.200 | 12.29 |
| SAM-4 | piperidine | 2.87 | 1.70 | 0.200 | 12.43 |
| SAM-5 | tetramethyl ammonium hydroxide | <0 | 1.82 | 0.200 | 13.45 |
| SAM-6 | tetramethyl ammonium hydroxide | <0 | 0.40 | 0.044 | 12.89 |
| SAM-7 | tetramethyl ammonium hydroxide | <0 | 0.20 | 0.022 | 12.60 |
| SAM-8 | 2-amino ethanol | 4.50 | 0.50 | 0.082 | 11.36 |
| SAM-9 | 2-(diethylamino) ethanol | 3.90 | 0.70 | 0.060 | 11.63 |
| ALK-1 | potassium carbonate | 3.69 | 1.38 | 0.100 | 11.80 |
| ALK-2 | sodium hydroxide | <0 | 0.80 | 0.200 | 13.41 |
| ALK-3 | sodium hydroxide | <0 | 0.20 | 0.050 | 12.92 |

*)Value of aqueous solution at 25° C.
[pKb = 14 − pKa (acid dissociation index of portion complex)]

(4) Evaluation of Residual Film Characteristics:

A silicon wafer having a diameter of 4 inches was coated by a spin coating method with the photosensitive polyimide solution (PPI1), followed by heating the coating on a hot plate set at 100° C. for 3 minutes (pre-baking) to form a resin layer having a thickness of about 5 $\mu$m. The initial film thickness was measured by a Taly Step (Taylor-Hobson Model). Then, the surface of the resin layer was selectively exposed to light by using a light exposure apparatus PLA-501FA manufactured by Cannon Corporation with a quartz mask for evaluating the residual film characteristics disposed on the resin layer.

After the light exposure step, the silicon wafer was dipped for 30 seconds (or 60 seconds) in the developing solution shown in Table 4, followed by applying a water wash for 20 seconds. Finally, the resin layer was dried with a nitrogen air gun so as to prepare a polyimide precursor pattern film

EXAMPLES 1–7 AND COMPARATIVE EXAMPLES 1 TO 15

A cross section of the pattern film was cut and peeled off with a razor, followed by measuring the film thickness in the light-exposed portion and the non-exposed portion with a Taly Step. The residual film characteristics were determined by comparison of the film thickness thus measured with the initial film thickness. Table 4 shows the results.

TABLE 4

| | Photo-sensitive polyimide | Film thickness ($\mu$m) | Light irradiation amount (mJ/cm$^2$) | Developing solution | Developing time (sec) | Residual film rate in light-exposed portion (%) | Residual film rate in non-exposed portion (%) |
|---|---|---|---|---|---|---|---|
| Example 1 | PPI1 | 5.0 | 300 | DEV-1 | 30 | 0 | 96 |
| Example 2 | PPI1 | 5.0 | 300 | DEV-2 | 30 | 0 | 95 |
| Example 3 | PPI1 | 5.0 | 300 | DEV-3 | 30 | 0 | 95 |
| Example 4 | PPI1 | 5.0 | 300 | DEV-4 | 30 | 0 | 95 |
| Example 5 | PPI1 | 5.0 | 300 | DEV-5 | 30 | 0 | 88 |

TABLE 4-continued

| | Photo-sensitive polyimide | Film thickness ($\mu$m) | Light irradiation amount (mJ/cm$^2$) | Developing solution | Developing time (sec) | Residual film rate in light-exposed portion (%) | Residual film rate in non-exposed portion (%) |
|---|---|---|---|---|---|---|---|
| Example 6 | PPI1 | 5.0 | 300 | DEV-6 | 30 | 0 | 82 |
| Example 7 | PPI1 | 5.0 | 300 | DEV-7 | 30 | 0 | 96 |
| Comparative Example 1 | PPI1 | 5.0 | 300 | WAM-1 | 30 | 100 | 100 |
| Comparative Example 2 | PPI1 | 5.0 | 300 | WAM-2 | 30 | 100 | 100 |
| Comparative Example 3 | PPI1 | 5.0 | 300 | WAM-3 | 30 | 100 | 100 |
| Comparative Example 4 | PPI1 | 5.0 | 300 | SAM-1 | 30 | 0 | 38 |
| Comparative Example 5 | PPI1 | 5.0 | 300 | SAM-2 | 30 | 0 | 12 |
| Comparative Example 6 | PPI1 | 5.0 | 300 | SAM-3 | 30 | 0 | 0 |
| Comparative Example 7 | PPI1 | 5.0 | 300 | SAM-4 | 30 | 0 | 0 |
| Comparative Example 8 | PPI1 | 5.0 | 300 | SAM-5 | 30 | 0 | 0 |
| Comparative Example 9 | PPI1 | 5.0 | 300 | SAM-6 | 60 | 0 | 42 |
| Comparative Example 10 | PPI1 | 5.0 | 300 | SAM-7 | 60 | 5 | 55 |
| Comparative Example 11 | PPI1 | 5.0 | 300 | SAM-8 | 60 | 0 | 56 |
| Comparative Example 12 | PPI1 | 5.0 | 300 | SAM-9 | 60 | 0 | 48 |
| Comparative Example 13 | PPI1 | 5.0 | 300 | ALK-1 | 30 | 0 | 0 |
| Comparative Example 14 | PPI1 | 5.0 | 300 | ALK-2 | 30 | 0 | 0 |
| Comparative Example 15 | PPI1 | 5.0 | 300 | ALK-3 | 60 | 0 | 40 |

Table 4 supports the excellent effects of the present invention, as apparent from the comparison based on the same concentration (0.2 mol/L (liter)) of the developing solution. Specifically, in the case of using the developing solution of the present invention, the residual film is 0 in the light-exposed portion and the residual film in the non-exposed portion is 82 to 96% in the non-exposed portion (Examples 1 to 7), supporting good residual film characteristics. However, in the case of using the developing solution using an amine compound, which was weakly basic (pKb >8) compared with the amine compound specified in the present invention, any of the light-exposed portion and the non-exposed portion was not dissolved, failing to form a pattern (Comparative Examples 1 to 3). Also, in the case of using the developing solution using an amine compound, which was strongly basic (pKb<5) compared with the amine compound specified in the present invention, and an inorganic alkali salt, the residual film rate in the non-exposed portion is 0 to 38%, supporting very poor residual film characteristics (Comparative Examples 4–8, 13 and 14). Further, in the case of using the developing solution using an amine compound, which was strongly basic (pKb<5) compared with the amine compound specified in the present invention, and an inorganic alkali salt, said developing solution being diluted with a diluent about 10 times as much as the developing solution, it is certainly possible to form a pattern if the developing time is prolonged to 60 seconds. However, the residual film characteristics remained to be as high as 40 to 56% (Comparative Examples 9, 11, 12 and 15).

The experimental data support that the developing solution of the present invention permits markedly improving the residual film characteristics of the positive photosensitive polyimide of the type that a photosensitive dissolution inhibitor is added thereto, making it possible to perform a pattern formation with a high residual film rate.

(5) Evaluation of Resolution Characteristics:

First of all, a solution of each photosensitive resin composition shown in Tables 5 to 8 was coated on the surface of a silicon wafer 4 inches in diameter by means of a spin-coating method, and then the coated layer was heated (pre-baking) for 3 minutes on a hot plate heated up to 100° C. thereby to form a resin layer having a film thickness of about 5 $\mu$m. The initial film thickness was measured by a Taly Step. Then, the resin layer was exposed through a quartz mask for resolution test to the irradiation of light at a predetermined exposure dose by using a light exposure apparatus (PLA-501FA, Canon Co., Ltd.).

Then, the silicon wafer was dipped in each developing solution shown in Tables 5 to 8 for 40 to 120 seconds, followed by water wash for 20 seconds. Finally, the resin layer was dried with a nitrogen air gun to form a polyimide precursor pattern film

EXAMPLES 8 TO 66 AND COMPARATIVE EXAMPLES 16 TO 69

The film thickness in the light-exposed portion and the non-exposed portion was measured by a Taly Step. Further, a cross section of the formed pattern film was observed with an electron microscope (SEM). The results of the characteristic test are shown in Tables 5 to 8.

TABLE 5

|  | Photo-sensitive polyimide | Film thickness (μm) | Sensitivity (mJ/cm²) | Developing solution | Developing time (sec) | Resolution characteristics (μm) | Residual film rate in non-exposed portion (%) |
|---|---|---|---|---|---|---|---|
| Example 8 | PPI1 | 5.0 | 180 | DEV-8 | 60 | 5.0 | 96 |
| Example 9 | PPI1 | 5.0 | 180 | DEV-9 | 60 | 5.5 | 95 |
| Example 10 | PPI1 | 5.0 | 180 | DEV-10 | 60 | 7.0 | 88 |
| Example 11 | PPI1 | 5.0 | 180 | DEV-11 | 60 | 8.0 | 82 |
| Example 12 | PPI2 | 5.0 | 160 | DEV-8 | 60 | 5.0 | 95 |
| Example 13 | PPI2 | 5.0 | 160 | DEV-9 | 60 | 5.5 | 95 |
| Example 14 | PPI2 | 5.0 | 160 | DEV-10 | 60 | 7.0 | 86 |
| Example 15 | PPI2 | 5.0 | 160 | DEV-11 | 60 | 8.0 | 80 |
| Example 16 | PPI3 | 4.8 | 140 | DEV-12 | 40 | 4.0 | 96 |
| Example 17 | PPI3 | 4.8 | 140 | DEV-13 | 40 | 4.5 | 96 |
| Example 18 | PPI3 | 4.8 | 140 | DEV-14 | 40 | 5.0 | 89 |
| Example 19 | PPI3 | 4.8 | 140 | DEV-15 | 40 | 6.0 | 83 |
| Example 20 | PPI4 | 5.1 | 160 | DEV-8 | 60 | 4.5 | 95 |
| Example 21 | PPI4 | 5.1 | 160 | DEV-9 | 60 | 5.0 | 95 |
| Example 22 | PPI4 | 5.1 | 160 | DEV-10 | 60 | 6.0 | 85 |
| Example 23 | PPI4 | 5.1 | 160 | DEV-11 | 60 | 8.0 | 80 |
| Example 24 | PPI5 | 4.8 | 140 | DEV-12 | 40 | 4.0 | 97 |
| Example 25 | PPI5 | 4.8 | 140 | DEV-13 | 40 | 4.5 | 95 |
| Example 26 | PPI5 | 4.8 | 140 | DEV-14 | 40 | 5.0 | 88 |
| Example 27 | PPI5 | 4.8 | 140 | DEV-15 | 40 | 6.0 | 81 |
| Example 28 | PPI6 | 5.2 | 160 | DEV-12 | 40 | 5.0 | 96 |
| Example 29 | PPI6 | 5.2 | 160 | DEV-13 | 40 | 5.5 | 96 |
| Example 30 | PPI6 | 5.2 | 160 | DEV-14 | 40 | 7.0 | 89 |
| Example 31 | PPI6 | 5.2 | 160 | DEV-15 | 40 | 8.0 | 83 |
| Example 32 | PPI7 | 4.9 | 140 | DEV-12 | 60 | 4.0 | 95 |
| Example 33 | PPI7 | 4.9 | 140 | DEV-13 | 60 | 4.5 | 95 |
| Example 34 | PPI7 | 4.9 | 140 | DEV-14 | 60 | 5.0 | 88 |
| Example 35 | PPI7 | 4.9 | 140 | DEV-15 | 60 | 6.0 | 82 |
| Example 36 | PPI8 | 5.0 | 180 | DEV-8 | 60 | 5.0 | 96 |
| Example 37 | PPI8 | 5.0 | 180 | DEV-9 | 60 | 5.5 | 95 |
| Example 38 | PPI8 | 5.0 | 180 | DEV-10 | 60 | 7.0 | 88 |

TABLE 6

|  | Photo-sensitive polyimide | Film thickness (μm) | Sensitivity (mJ/cm²) | Developing solution | Developing time (sec) | Resolution characteristics (μm) | Residual film rate in non-exposed portion (%) |
|---|---|---|---|---|---|---|---|
| Example 39 | PPI9 | 5.0 | 160 | DEV-8 | 60 | 5.0 | 95 |
| Example 40 | PPI9 | 5.0 | 160 | DEV-9 | 60 | 5.5 | 95 |
| Example 41 | PPI9 | 5.0 | 160 | DEV-10 | 60 | 7.0 | 87 |
| Example 42 | PPI10 | 4.8 | 140 | DEV-12 | 40 | 4.0 | 95 |
| Example 43 | PPI10 | 4.8 | 140 | DEV-13 | 40 | 4.5 | 95 |
| Example 44 | PPI10 | 4.8 | 140 | DEV-14 | 40 | 5.0 | 85 |
| Example 45 | PPI11 | 5.1 | 160 | DEV-8 | 60 | 4.5 | 96 |
| Example 46 | PPI11 | 5.1 | 160 | DEV-9 | 60 | 5.0 | 95 |
| Example 47 | PPI11 | 5.1 | 160 | DEV-10 | 60 | 6.0 | 88 |
| Example 48 | PPI12 | 4.9 | 140 | DEV-12 | 40 | 4.0 | 95 |
| Example 49 | PPI12 | 4.9 | 140 | DEV-13 | 40 | 4.5 | 95 |
| Example 50 | PPI12 | 4.9 | 140 | DEV-14 | 40 | 5.0 | 86 |
| Example 51 | PPI13 | 4.8 | 140 | DEV-12 | 40 | 4.5 | 94 |
| Example 52 | PPI13 | 4.8 | 140 | DEV-13 | 40 | 5.0 | 94 |
| Example 53 | PPI14 | 5.1 | 160 | DEV-8 | 60 | 5.0 | 92 |
| Example 54 | PPI14 | 5.1 | 160 | DEV-9 | 60 | 6.0 | 92 |
| Example 55 | PPI15 | 4.9 | 140 | DEV-12 | 60 | 4.5 | 95 |
| Example 56 | PPI15 | 4.9 | 140 | DEV-13 | 60 | 5.0 | 94 |
| Example 57 | PPI16 | 4.8 | 140 | DEV-12 | 40 | 4.5 | 95 |
| Example 58 | PPI16 | 4.8 | 140 | DEV-13 | 40 | 5.0 | 94 |
| Example 59 | PPI17 | 5.1 | 160 | DEV-8 | 60 | 5.0 | 92 |
| Example 60 | PPI17 | 5.1 | 160 | DEV-9 | 60 | 6.0 | 91 |
| Example 61 | PPI18 | 4.9 | 140 | DEV-12 | 60 | 4.5 | 94 |
| Example 62 | PPI18 | 4.9 | 140 | DEV-13 | 60 | 5.0 | 94 |
| Example 63 | PPI19 | 4.8 | 140 | DEV-12 | 40 | 4.0 | 95 |
| Example 64 | PPI19 | 4.8 | 140 | DEV-13 | 40 | 4.5 | 95 |

TABLE 6-continued

|  | Photo-sensitive polyimide | Film thickness (μm) | Sensitivity (mJ/cm²) | Developing solution | Developing time (sec) | Resolution characteristics (μm) | Residual film rate in non-exposed portion (%) |
|---|---|---|---|---|---|---|---|
| Example 65 | PPI20 | 4.9 | 140 | DEV-12 | 60 | 4.0 | 96 |
| Example 66 | PPI20 | 4.9 | 140 | DEV-13 | 60 | 4.5 | 95 |
| Comparative Example 16 | PPI1 | 5.0 | 180 | SAM-6 | 60 | >30 | 42 |
| Comparative Example 17 | PPI1 | 5.0 | 180 | SAM-8 | 60 | 25 | 56 |
| Comparative Example 18 | PPI1 | 5.0 | 180 | SAM-9 | 60 | >30 | 48 |
| Comparative Example 19 | PPI1 | 5.0 | 180 | ALK-3 | 60 | >30 | 40 |
| Comparative Example 20 | PPI2 | 5.0 | 160 | SAM-6 | 60 | >30 | 35 |
| Comparative Example 21 | PPI2 | 5.0 | 160 | SAM-8 | 60 | 30 | 52 |

TABLE 7

|  | Photo-sensitive polyimide | Film thickness (μm) | Sensitivity (mJ/cm²) | Developing solution | Developing time (sec) | Resolution characteristics (μm) | Residual film rate in non-exposed portion (%) |
|---|---|---|---|---|---|---|---|
| Comparative Example 22 | PPI2 | 5.0 | 160 | SAM-9 | 60 | >30 | 42 |
| Comparative Example 23 | PPI2 | 5.0 | 160 | ALK-3 | 60 | >30 | 36 |
| Comparative Example 24 | PPI3 | 4.8 | 140 | SAM-6 | 80 | 25 | 56 |
| Comparative Example 25 | PPI3 | 4.8 | 140 | SAM-8 | 80 | 20 | 66 |
| Comparative Example 26 | PPI3 | 4.8 | 140 | SAM-9 | 80 | 20 | 60 |
| Comparative Example 27 | PPI3 | 4.8 | 140 | ALK-3 | 80 | 30 | 52 |
| Comparative Example 28 | PPI4 | 5.1 | 160 | SAM-6 | 60 | >30 | 44 |
| Comparative Example 29 | PPI4 | 5.1 | 160 | SAM-8 | 60 | 30 | 54 |
| Comparative Example 30 | PPI4 | 5.1 | 160 | SAM-9 | 60 | >30 | 50 |
| Comparative Example 31 | PPI4 | 5.1 | 160 | ALK-3 | 60 | >30 | 42 |
| Comparative Example 32 | PPI5 | 4.8 | 140 | SAM-6 | 80 | 25 | 58 |
| Comparative Example 33 | PPI5 | 4.8 | 140 | SAM-8 | 80 | 20 | 62 |
| Comparative Example 34 | PPI5 | 4.8 | 140 | SAM-9 | 80 | 20 | 60 |
| Comparative Example 35 | PPI5 | 4.8 | 140 | ALK-3 | 80 | 30 | 52 |
| Comparative Example 36 | PPI6 | 5.2 | 160 | SAM-6 | 80 | 30 | 51 |
| Comparative Example 37 | PPI6 | 5.2 | 160 | SAM-8 | 80 | 30 | 58 |
| Comparative Example 38 | PPI6 | 5.2 | 160 | SAM-9 | 80 | 30 | 55 |
| Comparative Example 39 | PPI6 | 5.2 | 160 | ALK-3 | 80 | 30 | 50 |
| Comparative Example 40 | PPI7 | 4.9 | 140 | SAM-6 | 120 | 25 | 55 |
| Comparative Example 41 | PPI7 | 4.9 | 140 | SAM-8 | 120 | 20 | 62 |
| Comparative Example 42 | PPI7 | 4.9 | 140 | SAM-9 | 120 | 20 | 60 |
| Comparative | PPI7 | 4.9 | 140 | ALK-3 | 120 | 30 | 52 |

TABLE 7-continued

|  | Photo-sensitive polyimide | Film thickness (μm) | Sensitivity (mJ/cm²) | Developing solution | Developing time (sec) | Resolution characteristics (μm) | Residual film rate in non-exposed portion (%) |
|---|---|---|---|---|---|---|---|
| Comparative Example 43 | | | | | | | |
| Comparative Example 44 | PPI8 | 5.0 | 180 | SAM-6 | 60 | >30 | 40 |
| Comparative Example 45 | PPI8 | 5.0 | 180 | SAM-8 | 60 | 30 | 51 |
| Comparative Example 46 | PPI9 | 5.0 | 160 | SAM-6 | 60 | >30 | 33 |
| Comparative Example 47 | PPI9 | 5.0 | 160 | SAM-8 | 60 | 30 | 50 |
| Comparative Example 48 | PPI10 | 4.8 | 140 | SAM-6 | 80 | 30 | 55 |
| Comparative Example 49 | PPI10 | 4.8 | 140 | SAM-8 | 80 | 25 | 62 |
| Comparative Example 50 | PPI11 | 5.1 | 160 | SAM-6 | 60 | >30 | 40 |
| Comparative Example 51 | PPI11 | 5.1 | 160 | SAM-8 | 60 | 30 | 52 |
| Comparative Example 52 | PPI12 | 4.9 | 140 | SAM-6 | 80 | 30 | 50 |
| Comparative Example 53 | PPI12 | 4.9 | 140 | SAM-8 | 80 | 30 | 57 |
| Comparative Example 54 | PPI13 | 4.8 | 140 | SAM-6 | 80 | 30 | 48 |
| Comparative Example 55 | PPI13 | 4.8 | 140 | SAM-8 | 80 | 30 | 56 |

TABLE 8

|  | Photo-sensitive polyimide | Film thickness (μm) | Sensitivity (mJ/cm²) | Developing solution | Developing time (sec) | Resolution characteristics (μm) | Residual film rate in non-exposed portion (%) |
|---|---|---|---|---|---|---|---|
| Comparative Example 56 | PPI14 | 5.1 | 160 | SAM-6 | 60 | >30 | 38 |
| Comparative Example 57 | PPI14 | 5.1 | 160 | SAM-8 | 60 | 30 | 49 |
| Comparative Example 58 | PPI15 | 4.9 | 140 | SAM-6 | 80 | 30 | 50 |
| Comparative Example 59 | PPI15 | 4.9 | 140 | SAM-8 | 80 | 30 | 55 |
| Comparative Example 60 | PPI16 | 4.8 | 140 | SAM-6 | 80 | 30 | 50 |
| Comparative Example 61 | PPI16 | 4.8 | 140 | SAM-8 | 80 | 30 | 57 |
| Comparative Example 62 | PPI17 | 5.1 | 160 | SAM-6 | 60 | >30 | 41 |
| Comparative Example 63 | PPI17 | 5.1 | 160 | SAM-8 | 60 | 30 | 50 |
| Comparative Example 64 | PPI18 | 4.9 | 140 | SAM-6 | 80 | 30 | 52 |
| Comparative Example 65 | PPI18 | 4.9 | 140 | SAM-8 | 80 | 30 | 57 |
| Comparative Example 66 | PPI19 | 4.8 | 140 | SAM-6 | 80 | 30 | 56 |
| Comparative Example 67 | PPI19 | 4.8 | 140 | SAM-8 | 80 | 25 | 60 |
| Comparative Example 68 | PPI20 | 4.9 | 140 | SAM-6 | 80 | 30 | 61 |
| Comparative Example 69 | PPI20 | 4.9 | 140 | SAM-8 | 80 | 25 | 65 |

In the case of using the developing solution of the present invention (Examples 8 to 66), it was possible to form a fine positive pattern having a line and space of 4.0 to 8.0 μm with a high residual film rate of 80 to 97%. In the case of using an amine compound having a strong basicity (pKb<5), compared with the amine compound specified in the present invention, and an inorganic alkali salt, the residual film rate was 33 to 66%, and the resolution characteristics were not lower than 20 $\mu$m, resulting in failure to form a fine pattern, as shown in Comparative Examples 16 to 69.

As apparent from the experimental data, the developing solution of the present invention permits markedly improving the residual film characteristics of the positive photosensitive polyimide of the type that a photosensitive dissolution inhibitor is added thereto, making it possible to perform a pattern formation with a high residual film rate.

(6) Trial Manufacture of an Electronic Part:

Various electronic parts shown in FIGS. 1 to 4 were manufactured on the trial basis by using the polyimide film pattern forming method of the present invention.

FIG. 1 illustrates a cross-sectional view of a semiconductor device provided with a passivation film consisting of a polyimide pattern which was formed by using a pattern forming method of the present invention. In this case, the photosensitive polyimide material of Example PPI5 was employed for forming a patterned polyimide film to be utilized as a passivation film as explained below.

First of all, the photosensitive polyimide material was coated on the surface of a silicon substrate (wafer) bearing thereon a PNP type transistor on which a thermal oxide film and electrodes were formed. The coated layer was pre-baked for 10 minutes at a temperature of 100° C. to obtain a resin layer having a film thickness of about 8 $\mu$m. Subsequently, the resin layer was exposed through a quartz mask to the irradiation of light at a dosage of 300 mJ/cm$^2$ by using a light exposure apparatus (PLA-501FA, Canon Co.).

After this light exposure, the silicon substrate was dipped in the developing solution of the present invention (aqueous solution of 3 wt % N-methyl imidazole) for 60 seconds thereby allowing the exposed portions of the resin layer to be selectively dissolved and removed. Thereafter, the resin layer was rinsed with water for 20 seconds. Finally, the resin layer was dried with a nitrogen air gun, followed by heating the pattern thus obtained at 150° C. for 60 minutes, at 250° C. for 60 minutes, and at 350° C. for 60 minutes in a program oven, thereby obtaining a polyimide film pattern.

Referring to FIG. 1, a bonding pad 12 is formed on an LSI chip 11 mounted on a tab 13, and a passivation film 14 consisting of a patterned polyimide film is superimposed thereon. The bonding pad 12 formed on the LSI chip 11 is connected via a bonding wire 15 to a lead frame 16. Furthermore, these members are entirely encapsulated with a sealing agent 17.

When a passivation film 14 consisting of a patterned polyimide film formed by a pattern forming method of the present invention is employed in the manufacture of a semiconductor element, it is possible to obtain a semiconductor element which is excellent in reliability while substantially preventing any defective product from being produced in the manufacturing steps. Moreover, since the conventional PEP step can be dispensed with, the manufacturing process would be simplified without giving rise to any problem involving safety, etc.

Figure 2:
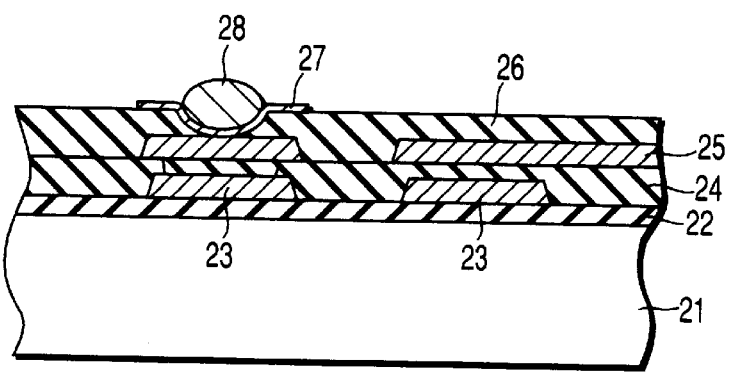
FIG. 2 is a cross-sectional view of a multi-chip module provided with an interlayer insulating film consisting of a polyimide film pattern which has been obtained by pattern forming method according to the present invention.

FIG. 2 illustrates a cross-sectional view showing a portion of a multi-chip module provided with an interlayer insulation film which was formed using a pattern forming method of the present invention. In this case, a polyimide film which was formed by using the photosensitive polyimide material PPI3 and patterned in the same manner as mentioned above was utilized as the interlayer insulation film.

Referring to FIG. 2, a thermal oxide film 22 is formed on the surface of a silicon substrate (wafer) 21. On this thermal oxide film 22, a copper wiring 23, an interlayer insulation film 24 consisting of a polyimide film, another copper wiring 25 and another interlayer insulation film 26 consisting of a polyimide film are successively superimposed. Furthermore, a contact hole is formed at a portion of the upper interlayer insulation film 26. A Pb/Sn electrode 27 connected to the copper wiring 23 and BLM (Ball Limiting Metallization) 28 are also formed.

Since the interlayer insulation films 24 and 26 are formed through a curing of a spin-coated layer of a solution comprising a photosensitive polyimide, the step portions to be formed due to the presence of the copper wiring can be greatly minimized, thus making it possible to flatten the surface of the device and to obtain a highly reliable wiring structure.

Figure 3:
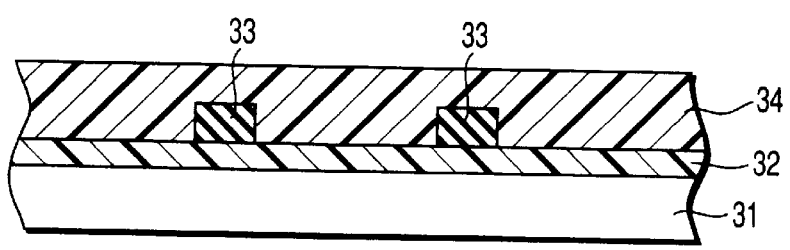
FIG. 3 is a cross-sectional view of an optical waveguide provided with a polymer core layer consisting of a polyimide film pattern which has been obtained by pattern forming method according to the present invention.

FIG. 3 illustrates a cross-sectional view showing an embedded optical waveguide provided with a core layer consisting of a polyimide film which was formed using a pattern forming method of the present invention. In this case, a polyimide film which was formed by using the photosensitive polyimide material of PPI7 and patterned in the same manner as mentioned above was utilized as a polymer core layer.

Referring to FIG. 3, a lower clad layer 32 consisting of a heat-cured PAA8 film is formed on the surface of a silicon substrate (wafer) 31. On this lower clad layer 32, a core polymer layer 33 and an upper clad layer 34 consisting of a heat-cured PAA8 film are successively superimposed.

Since the core polymer layer 33 can be formed easily and precisely by using a polyimide pattern forming method of the present invention, the conventional PEP step can be dispensed with, so that the productivity of the device can be greatly improved.

Figure 4:
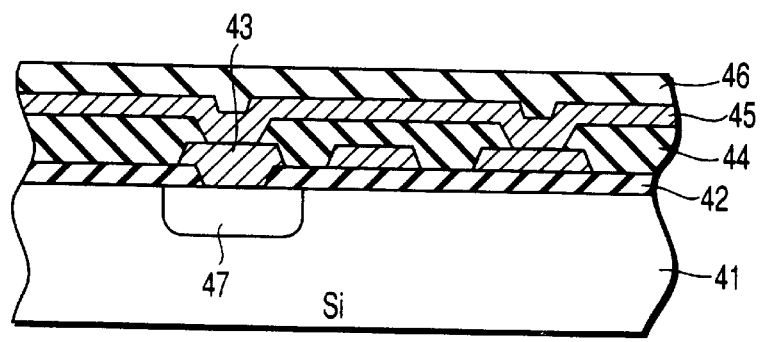
FIG. 4 is a cross-sectional view of a semiconductor element having a multilayered wiring structure comprising an interlayer insulating film consisting of a polyimide film pattern which has been obtained by pattern forming method according to the present invention.

FIG. 4 illustrates a cross-sectional view showing a semiconductor element having a multilayered wiring structure provided with an interlayer insulation film consisting of a polyimide film pattern which was formed using a pattern forming method of the present invention. In this case, a polyimide film which was formed by using the photosensitive polyimide material in Example PPI3 and patterned in the same manner as mentioned above was utilized as the interlayer insulation film.

Referring to FIG. 4, a thermal oxide film 42 is formed on the surface of a silicon substrate (wafer) 41 bearing thereon an element region 47. A contact hole is formed at a portion of this thermal oxide film 42, and a first Al wiring 43 is formed over the contact hole. An interlayer insulation film 44 consisting of a polyimide film is superimposed on this first Al wiring 43. Furthermore, another contact hole is formed at a portion of the interlayer insulation film 44, and a second Al wiring 45 connected to the first Al wiring 43 is formed over the latter contact hole. Further superimposed on this second Al wiring 45 is another interlayer insulation film 46 made of a polyimide film.

Since the interlayer insulation film 44 is formed through a curing of a spin-coated layer of a solution comprising a photosensitive polyimide, the step portions to be formed on the surface of substrate can be greatly minimized, thus making it possible to form multi-layered Al wirings while maintaining the flatness of the surface of the device and to obtain a highly reliable wiring structure.

As described above in detail, the developing solution of the present invention for a photosensitive polyimide makes it possible to markedly improve the resolution characteristics and the residual film characteristics of the photosensitive polyimide of the type that a photosensitive dissolution inhibitor is added thereto. As a result, use of the developing solution of the present invention for a photosensitive polyimide in the developing step of the photosensitive polyimide produces a prominent effect that a polyimide film pattern of a high resolution can be formed with a high residual film rate.

Further, it is also possible to provide a highly reliable electronic parts wherein a polyimide film pattern excellent in resolution, adhesion and heat resistance is utilized as an insulating member, a protecting film member, a liquid crystal member or an optical waveguide member by forming a polyimide film pattern on a substrate surface by the polyimide film pattern forming method of the present invention.

Therefore, the patterned polyimide film of the present invention can be used as a wiring insulating film for an LSI, as a humidity resistant protecting film for an LSI, as an α-ray shielding film for an LSI, as a passivation film for a semiconductor device, as a wiring insulating film for a multi-chip module, as a wiring insulating film for a thin film magnetic head, as a wiring insulating film for a magnetic bubble memory, or as an optical material for forming an optical waveguide of an optical device or as an orienting film of a liquid crystal display device.

Further, the electronic part of the present invention comprises a polyimide film excellent in resolution, heat resistance, and adhesivity, which is formed on the surface of an element such as a silicon substrate or a glass substrate, said polyimide film acting as an insulating member, a protective film member, a member of a liquid crystal element or a member of an optical device. It follows that the electronic part of the present invention is excellent in reliability.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of forming a pattern of a polyimide film, comprising the steps of:

(I) coating a substrate surface with a photosensitive polyimide solution of a positive type containing a polyimide precursor and a photosensitive dissolution inhibitor, followed by heating the coating to form a resin layer;

(II) selectively exposing a desired region of said resin layer to light;

(III) developing the resin layer after the light exposure with a developing solution comprising an aqueous solution of an amine compound having a base dissociation index pKb of 5 to 8 within an aqueous solution of 25° C.; and (IV) applying a heat treatment to the resin layer after the development.

2. The method of forming a polyimide film pattern according to claim 1 wherein said polyimide cursor has a repeating unit represented by general formula (1):

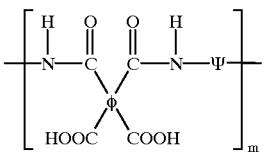

where φ represents a tetravalent organic group selected from the group consisting of a substituted or unsubstituted aliphatic hydrocarbon group having 1 to 30 carbon atoms, a substituted or unsubstituted alicyclic hydrocarbon group having 1 to 30 carbon atoms, a substituted or unsubstituted aromatic hydrocarbon group having 1 to 30 carbon atoms, a substituted or unsubstituted heterocyclic group having 1 to 30 carbon atoms, and a compound radical having said aliphatic hydrocarbon group, alicyclic hydrocarbon group, aromatic hydrocarbon group, and heterocyclic group mutually coupled with each other directly or with a crosslinking group interposed therebetween; Ψ represents a divalent organic group selected from the group consisting of a substituted or unsubstituted aliphatic hydrocarbon group having 1 to 30 carbon atoms, a substituted or unsubstituted alicyclic hydrocarbon group having 1 to 30 carbon atoms, a substituted or unsubstituted aromatic hydrocarbon group having 1 to 30 carbon atoms, a substituted or unsubstituted heterocyclic group having 1 to 30 carbon atoms, and a compound radical having said aliphatic hydrocarbon group, alicyclic hydrocarbon group, aromatic hydrocarbon group, and heterocyclic group mutually coupled with each other directly or with a crosslinking group interposed therebetween; and m is a positive integer.

3. The method of forming a polyimide film pattern according to claim 1, wherein said polyimide precursor is synthesized by the reaction within an organic solvent among 1.0 molar equivalent of tetracarboxylic dianhydride component containing at least 0.6 molar equivalent of at least one kind of diphthalic dianhydride selected from the group consisting of 3,3',4,4'-benzophenone tetracarboxylic dianhydride, methylene-4,4'-diphthalic dianhydride, 1,1--ethylidene-4,4'-diphthalic dianhydride, 2,2-propylidene-4,4'-diphthalic dianhydride, 1,1,1,3,3,3-hexafluoro-2,2-propylidene-4,4'-diphthalic dianhydride, oxy-4,4'-diphthalic dianhydride, thio-4,4'-diphthalic dianhydride, sulfonyl-4,4'-diphthalic acid dianhydride, 1,3-bis(3,4-dicarboxyphenyl)-1,1,3,3-tetramethyl disiloxane dianhydride, 9-phenyl-9-(trifluoromethyl)xantene-2,3,6,7-tetracarboxylic dianhydride, and 9,9-bis(trifluoromethyl)xantene-2,3,6,7-tetracarboxylic dianhydride; 0.8 to 1.2 molar equivalent of diamine compound containing at least 0.6 molar equivalent of at least one kind of a dianiline derivative selected from the group consisting of oxy-3,3'-dianiline, oxy-3,4'-dianiline, oxy-4,4'-dianiline, sulfonyl-3,3'-dianiline, sulfonyl-4,4'-dianiline, methylene-3,3'-dianiline, methylene-4,4'-dianiline, 2,2-propylidene-3,3'-dianiline, 2,2-propylidene-4,4'-dianiline, 1,1,1,3,3,3-hexafluoro-2,2-propylidene-3,3'-dianiline, 1,1,1,3,3,3-hexafluoro-2,2-propylidene-4,4'-dianiline, 1,1,1,3,3,3-hexafluoro-2,2-propylidene-5,5'-di(2-toluidine), and 1,1,1,3,3,3-hexafluoro-2,2-propylidene-4,4'-bis(2-aminophenol); and 0.02 to 0.2 molar equivalent of at least one kind of siloxane compound selected from the group consisting of 1,3-bis(3-aminopropyl)-1,1,3,3-tetramethyl disiloxane, 1,5-bis(3-aminopropyl)-1,1,3,3,5,5-hexamethyl trisiloxane, 1,7-bis(3-aminopropyl)-1,1,3,3,5,5,7,7- octamethyl tetrasiloxane, and 1,11--bis(3-aminopropyl)-1,1,3,3,5,5,7,7,9,9,11,11--dodecamethyl hexasiloxane.

4. The method of forming a polyimide film pattern according to claim 1, wherein said photosensitive dissolution inhibitor is at least one naphthoquinone diazide compound selected from the compounds represented by general formulas (2) to (5):

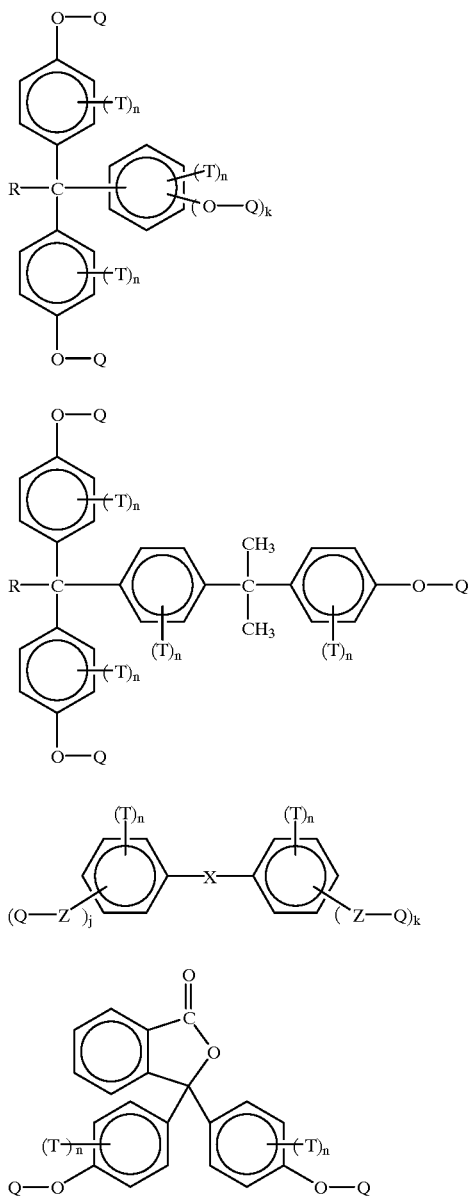

where Q, which may be the same or different, represents a hydrogen atom, a 1,2-naphthoquinone-2-diazide-4-sulfonyl group or a 1,2-naphthoquinone-2-diazide-5-sulfonyl group, at least one substituent Q being a 1,2-naphthoquinone-2-diazide-4-sulfonyl group or a 1,2-naphthoquinone-2-diazide-5-sulfonyl group;

R, which may be the same or different, represents a hydrogen atom, a substituted or unsubstituted aliphatic hydrocarbon group, a substituted or unsubstituted alicyclic hydrocarbon group, a substituted or unsubstituted aromatic hydrocarbon group, or a substituted or unsubstituted heterocyclic group;

T, which may be the same or different, represents a substituted or unsubstituted aliphatic hydrocarbon group, a substituted or unsubstituted alicyclic hydrocarbon group, a substituted or unsubstituted aromatic hydrocarbon group, or a substituted or unsubstituted heterocyclic group;

X, which may be the same or different, represents an oxy group, a thio group, a sulfonyl group, a carbonyl group, a methylene group, an ethylidene group, a 2,2-propylidene group, a 1,1,1,3,3,3-hexafluoro-2,2-propylidene group, a 1-phenyl-1,1--ethylidene group, a 1,1-cyclohexylidene group, or a 9,9-fluorenylidene group;

Z, which may be the same or different, represents an oxy group or an imino group, j is an integer of 0 to 3, k, which may be the same or different, is an integer of 1 to 3, and n, which may be the same or different, is an integer of 0 to 4.

5. The method of forming a polyimide film pattern according to claim 1, wherein the base dissociation index pKb of said amine compound within an aqueous solution of 25° C. is 6 to 7.

6. The method of forming a polyimide film pattern according to claim 1, wherein the concentration of said amine compound is 0.1 to 20% by weight.

7. The method of forming a polyimide film pattern according to claim 1, wherein said amine compound is a tertiary amine compound.

8. The method of forming a polyimide film pattern according to claim 7, wherein said tertiary amine compound is selected from the group consisting of a substituted or unsubstituted N-substituted imidazole, a substituted or unsubstituted N-substituted morpholine, a substituted or unsubstituted N-substituted pyrroline, a substituted or unsubstituted N-(2-cyanoethyl)piperazine, a substituted or unsubstituted N-substituted propargyl piperazine, a substituted or unsubstituted N-(2-hydroxyethyl)piperazine, a substituted or unsubstituted 2-(N,N-disubstituted amino) propionitrile, a substituted or unsubstituted N,N-disubstituted propargylamine, a substituted or unsubstituted triethanol amine, a substituted or unsubstituted N-substituted diethanol amine, and a substituted or unsubstituted N,N-disubstituted tris(hydroxymethyl)amino methane.

9. The method of forming a polyimide film pattern according to claim 8, wherein said tertiary amine compound is a substituted or unsubstituted N-substituted imidazole.

10. The method of forming a polyimide film pattern according to claim 2, wherein the base dissociation index pKb of said amine compound within an aqueous solution of 25° C. is 6 to 7.

11. The method of forming a polyimide film pattern according to claim 2, wherein the concentration of said amine compound is 0.1 to 20% by weight.

12. The method of forming a polyimide film pattern according to claim 2, wherein said amine compound is a tertiary amine compound.

13. The method of forming a polyimide film pattern according to claim 12, wherein said tertiary amine compound is selected from the group consisting of a substituted of unsubstituted N-substituted imidazole, a substituted or unsubstituted N-substituted morpholine, a substituted or unsubstituted N-substituted pyrroline, a substituted or unsubstituted N-(2-cyanoethyl)piperazine, a substituted or unsubstituted N-substituted propargyl piperazine, a substituted or unsubstituted N-(2-hydroxyethyl)piperazine, a substituted or unsubstituted 2-(N,N-disubstituted amino) propionitrile, a substituted or unsubstituted N,N-disubstituted propargylamine, a substituted or unsubstituted triethanol amine, a substituted or unsubstituted N-substituted diethanol amine, and a substituted or unsubstituted N,N-disubstituted tris(hydroxymethyl)amino methane.

14. The method of forming a polyimide film pattern according to claim 13, wherein said tertiary amine compound is a substituted or unsubstituted N-substituted imidazole.

15. The method of forming polyimide film pattern according to claim 13, wherein the base dissociation index pKb of said amine compound within an aqueous solution of 25° C. is 6 to 7.

16. The method of forming a polyimide film pattern according to claim 3, wherein the concentration of said amine compound is 0.1 to 20% by weight.

17. The method of forming a polyimide film pattern according to claim 3, wherein said amine compound is a tertiary amine compound.

18. The method of forming a polyimide film pattern according to claim 4, wherein the base dissociation index pKb of said amine compound within an aqueous solution of 25° C. is 6 to 7.

19. The method of forming a polyimide film pattern according to claim 4, wherein the concentration of said amine compound is 0.1 to 20% by weight.

20. The method of forming a polyimide film pattern according to claim 4, wherein said amine compound is a tertiary amine compound.

* * * * *

UNITED STATES PATENT AND TRADEMARK OFFICE
CERTIFICATE OF CORRECTION

PATENT NO. : 6,316,170 B2
DATED : November 13, 2001
INVENTOR(S) : Kawamonzen et al.

It is certified that error appears in the above-identified patent and that said Letters Patent is hereby corrected as shown below:

<u>Title page,</u>
Item [45], the Date of Patent should read:
-- [45] Date of Patent: *Nov. 13, 2001 --

The Notice information should read:
-- (*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

Signed and Sealed this

Seventh Day of May, 2002

*Attest:*

*Attesting Officer*

JAMES E. ROGAN
*Director of the United States Patent and Trademark Office*